US006656273B1

(12) United States Patent
Toshima et al.

(10) Patent No.: US 6,656,273 B1
(45) Date of Patent: Dec. 2, 2003

(54) FILM FORMING METHOD AND FILM FORMING SYSTEM

(75) Inventors: Takayuki Toshima, Yamanashi-Ken (JP); Nobuo Konishi, Yamanashi-Ken (JP); Yoji Mizutani, Kawasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/593,948

(22) Filed: Jun. 15, 2000

(30) Foreign Application Priority Data

| Jun. 16, 1999 | (JP) | 11-169510 |
| Sep. 28, 1999 | (JP) | 11-274787 |
| Mar. 22, 2000 | (JP) | 2000-079850 |

(51) Int. Cl.$^7$ ................................. B05C 9/14
(52) U.S. Cl. ..................... 118/56; 118/59; 118/66; 118/58
(58) Field of Search ................ 118/52, 56, 319, 118/320, 313, 641, 642, 58, 59, 66; 427/240, 425

(56) References Cited

U.S. PATENT DOCUMENTS

| 5,433,785 A | * | 7/1995 | Saito .......................... 118/719 |
| 5,565,034 A | | 10/1996 | Nanbu et al. ................ 118/668 |
| 5,725,664 A | | 3/1998 | Nanbu et al. .................. 118/52 |
| 5,759,214 A | * | 6/1998 | Ohmi et al. ................ 29/25.01 |
| 6,113,694 A | * | 9/2000 | Davis .......................... 118/663 |
| 6,261,365 B1 | * | 7/2001 | Matsuyama et al. .......... 118/50 |
| 6,350,316 B1 | * | 2/2002 | Hayashi et al. ............. 118/320 |

FOREIGN PATENT DOCUMENTS

JP          11-251311          9/1999

* cited by examiner

Primary Examiner—Richard Crispino
Assistant Examiner—George R. Koch, III
(74) Attorney, Agent, or Firm—Rader, Fishman & Grauer PLLC

(57) ABSTRACT

In an organic insulating film coating apparatus, an organic insulating film is applied onto a wafer by a spin coating. Thereafter, the wafer is subjected to heat processing and an inorganic insulating film is applied onto the wafer by a spin coating in an inorganic insulating film coating apparatus. After the coating of the inorganic insulating film, the wafer is subjected to aging processing and exchange-chemical coating processing. Thereafter, a solvent in the coating film is removed in a low-temperature heat processing apparatus and a low-oxygen and high-temperature heat processing apparatus, and thermal processing is performed for the wafer in a low-oxygen curing and cooling processing apparatus. The low-temperature heat processing apparatus, the low-oxygen and high-temperature heat processing apparatus, a delivery section for the wafer between the low-temperature heat processing apparatus and the low-oxygen and high-temperature heat processing apparatus, and a delivery section for the wafer between the low-oxygen and high-temperature heat processing apparatus and the low-oxygen curing and cooling processing apparatus are brought to low-oxygen atmospheres.

3 Claims, 22 Drawing Sheets

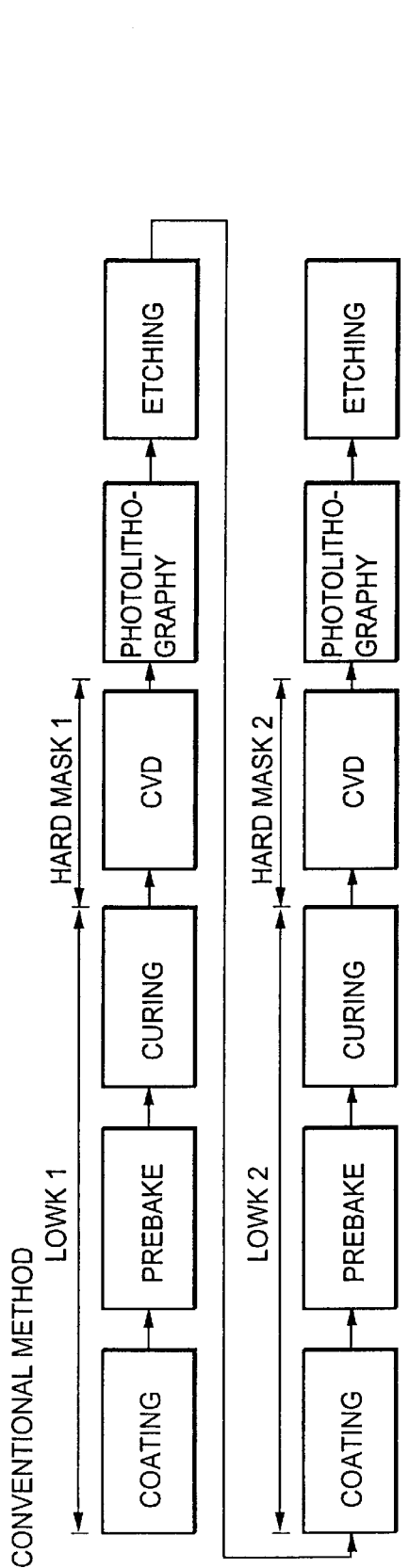
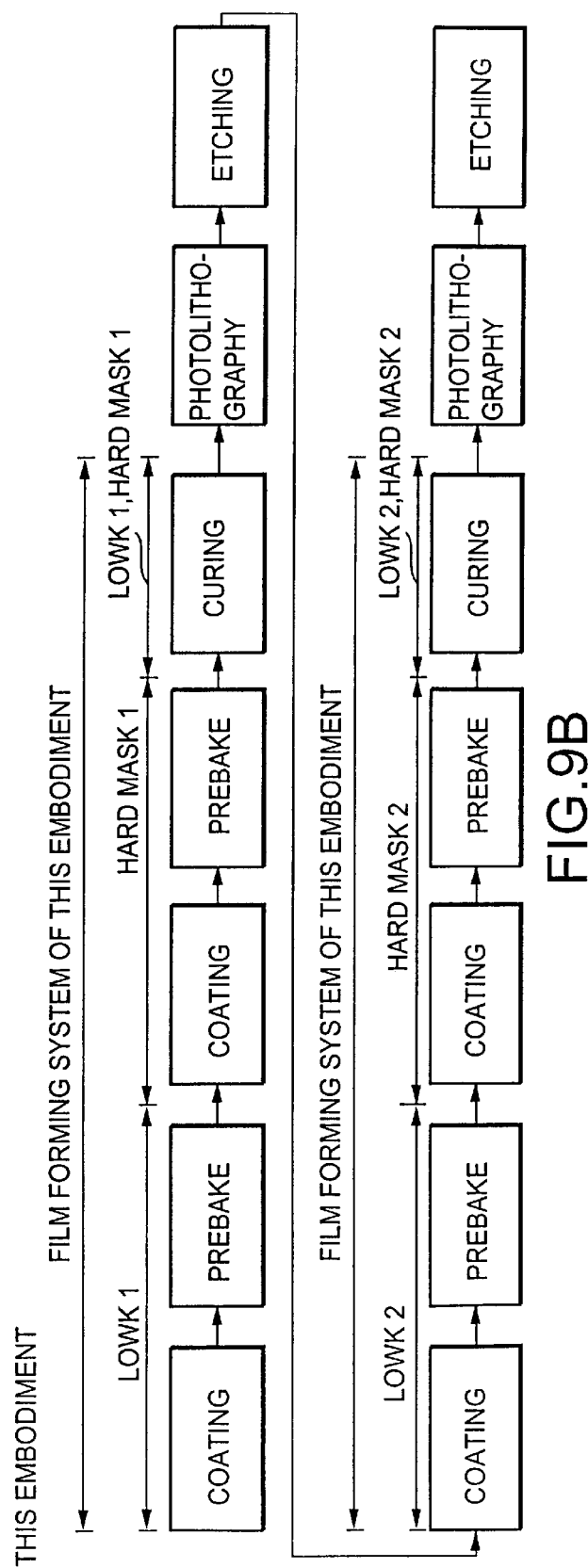
FIG.9A
FIG.9B

FILM FORMING METHOD AND FILM FORMING SYSTEM

BACKGROUND OF THE INVENTION

1. Field of the Invention

The present invention relates to a film forming method and a film forming system each for forming a coating film composed of an insulating film on a substrate such as an LCD substrate and a semiconductor wafer, for example.

2. Description of the Related Art

In processes of semiconductor device (hereinafter, referred to as "wafer") fabrication, an insulating film is formed on the front face of the wafer, for example, by an insulating film forming system. When an insulating film is formed in the insulating film forming system, a wafer is transferred from a carrier station to a processing section, and a predetermined coating solution for forming the insulating film is applied onto the wafer in a coating apparatus provided in the processing section. Subsequently, the wafer is transferred to a heat processing apparatus and subjected to processing for vaporizing a solvent in the coating solution. Thereafter, this wafer is combined with a predetermined volume of wafers to be put into an annealing furnace collectively. Then, the wafer is subjected to cure processing in the annealing furnace, whereby an insulating film such as an SOG film or the like, for example, is formed on the front face of the wafer.

Recently, with improvements in the wafer materials, a coating solution on the wafer reacts with oxygen more subtly, and therefore it has been desired that the wafer is processed in a lower oxygen atmosphere until cure processing in the annealing furnace. However, in the aforesaid insulating film forming system, since the wafer is exposed in the surrounding air in the heat processing apparatus for vaporizing the solvent in the coating solution and when transferred from the heat processing apparatus to the annealing furnace, the coating film on the wafer is susceptible to reacting with oxygen in the air resulting in occurrence of insufficient insulation or the like in the wafer.

Meanwhile, there is a damascene method in which a predetermined trench is formed in the formed insulating film in advance, a conductive wiring material is buried inside the trench, and the wiring material heaped outside the trench is removed by a CMP (chemical mechanical polishing) technique to thereby form a wiring. A wiring technique referred to as a dual damascene method as one of damascene methods is a technique that both a connecting hole and a trench for wiring previously formed in a layer insulating film are simultaneously buried with a wiring material to thereby form a connecting plug and a wiring simultaneously.

In the case where a semiconductor device is fabricated using the dual damascene method, there is a technique using a laminated layer of an inorganic insulating film and an organic insulating film as a layer insulating film between wirings in order to speed up the semiconductor device. Such inorganic insulating film used for the layer insulating film is generally formed by a plasma CVD method and the organic insulating film is formed by a spin coating.

However, there is a disadvantage that the formation of the inorganic insulating film by the CVD method and the organic insulating film by the spin coating requires a CVD apparatus and a coating apparatus by the spin coating which are completely different in structure, resulting in increased apparatus cost.

SUMMARY OF THE INVENTION

An object of the present invention is to form a coating film on a substrate and to retard a reaction between the coating film on the front face of the substrate and oxygen until the coating film is subjected to cure processing in an insulating film forming process.

Moreover, another object of the present invention is to provide a film forming method low in apparatus cost in a film forming method for forming a multi-layered film including an inorganic insulating film and a film forming system of the same.

To achieve the above objects, a first aspect of the present invention is a film forming method comprising the steps of: supplying a first coating solution onto a substrate to form a first coating film; and supplying a second coating solution onto the first coating film to form a second coating film, at least one of the first coating film and the second coating film being an inorganic film.

A second aspect of the present invention is a film forming method comprising the steps of: applying an organic insulating film material onto a substrate by a spin coating to form an organic insulating film; applying an inorganic insulating film material onto the applied organic insulating film material by a spin coating to form an inorganic insulating film; patterning the organic insulating film and the inorganic insulating film using a photolithography method to form a concave portion; and burying a conductive material in the concave portion to form a conductive layer.

A third aspect of the present invention is a film forming method comprising the steps of: applying an organic insulating film material onto a substrate by a spin coating to form a first organic insulating film; applying an inorganic insulating film material onto the applied organic insulating film material by a spin coating to form a second inorganic insulating film; applying an organic insulating film material onto a substrate by a spin coating to form a third organic insulating film; applying an inorganic insulating film material onto the applied organic insulating film material by a spin coating to form a fourth inorganic insulating film; patterning the third organic insulating film and the fourth inorganic insulating film using a photolithography method to form a first concave portion; patterning the first organic insulating film and the second inorganic insulating film using a photolithography method to form a second concave portion; and burying a conductive material in the first concave portion and the second concave portion to form a conductive layer.

A fourth aspect of the present invention is a film forming system comprising: a first coating apparatus for applying a first insulating film material onto a substrate; and a second coating apparatus for applying a second insulating film material onto the first insulating film material, the first insulating film material or the second insulating film material being an inorganic insulating film material.

A fifth aspect of the present invention is a film forming system comprising: a coating apparatus for supplying a coating solution to a substrate to form a coating film; a first heating apparatus for vaporizing a solvent component from the applied coating solution; a second heating apparatus for performing thermal processing for the substrate from which the solvent component has been vaporized in the first heating apparatus; and a delivery section for delivering the substrate between the first heating apparatus and the second heating apparatus, wherein the inside of a processing chamber of the first heating apparatus can be set at an atmosphere lower in oxygen than the surrounding air.

A sixth aspect of the present invention is a film forming system comprising: a coating apparatus for supplying a coating solution to a substrate to form a coating film; a first heating apparatus for vaporizing a solvent component from the applied coating solution; a second heating apparatus for performing thermal processing for the substrate from which the solvent component has been vaporized in the first heating apparatus; and a delivery section for delivering the substrate between the first heating apparatus and the second heating apparatus, wherein an area in which the second heating apparatus and the delivery section are disposed can be set at an atmosphere lower in oxygen than the surrounding air.

A seventh aspect of the present invention is a film forming system comprising: a coating apparatus for supplying a coating solution to a substrate to form a coating film; a first heating apparatus for vaporizing a solvent component from the applied coating solution; a second heating apparatus for performing thermal processing for the substrate from which the solvent component has been vaporized in the first heating apparatus; and a delivery section for delivering the substrate between the first heating apparatus and the second heating apparatus, wherein an area in which the second heating apparatus and the delivery section are disposed and the inside of a processing chamber of the first heating apparatus can be set at an atmosphere lower in oxygen than the surrounding, air.

According to the present invention, each of an insulating film and a hard mask is formed, for example, by applying a coating solution, so that it is unnecessary to provide a CVD apparatus, resulting in simplification of processes when the two-layered structure is formed.

Moreover, since the two-layered structure of an insulating film and a hard mask layer is formed sequentially by one apparatus including a first coating unit for applying a coating solution for an insulating film and a second coating unit for applying a coating solution for a hard mask, it is unnecessary to transfer the substrate to another apparatus, so that the film-forming processing can be remarkably simplified and thus the insulating film and the hard mask layer can be very speedily formed.

According to the present invention, since the inside of a processing chamber of the first heating apparatus, for example, can be set at a low-oxygen atmosphere, the inside of the processing chamber can be brought to a low-oxygen atmosphere as required. Accordingly, it becomes possible that the substrate carried into the processing chamber is subjected to heat processing in a low-oxygen atmosphere. Consequently, oxidation of the coating film applied on the substrate in the coating unit in reaction with oxygen is prevented.

According to the present invention, in the case where a wiring and a connecting plug are formed in a layered film of an organic insulating film and an inorganic insulating film through a dual damascene process, for example, since both the organic insulating film and the inorganic insulating film are formed using a spin coating, an apparatus such as a CVD apparatus becomes unnecessary, thereby greatly reducing fabricating apparatus cost. Moreover, an insulating film that is excellent in low dielectric constant characteristic and is good in adherence between the organic insulating film and the inorganic insulating film can be formed.

These objects and still other objects and advantages of the present invention will become apparent upon reading the following specification when taken in conjunction with the accompanying drawings.

BRIEF DESCRIPTION OF THE DRAWINGS

FIG. 9 is a process chart for explaining a conventional method and the method according to the first embodiment while comparing them;

DETAILED DESCRIPTION OF THE PREFERRED EMBODIMENT

A film forming system as a first embodiment of the present invention will be explained.

Figure 1:
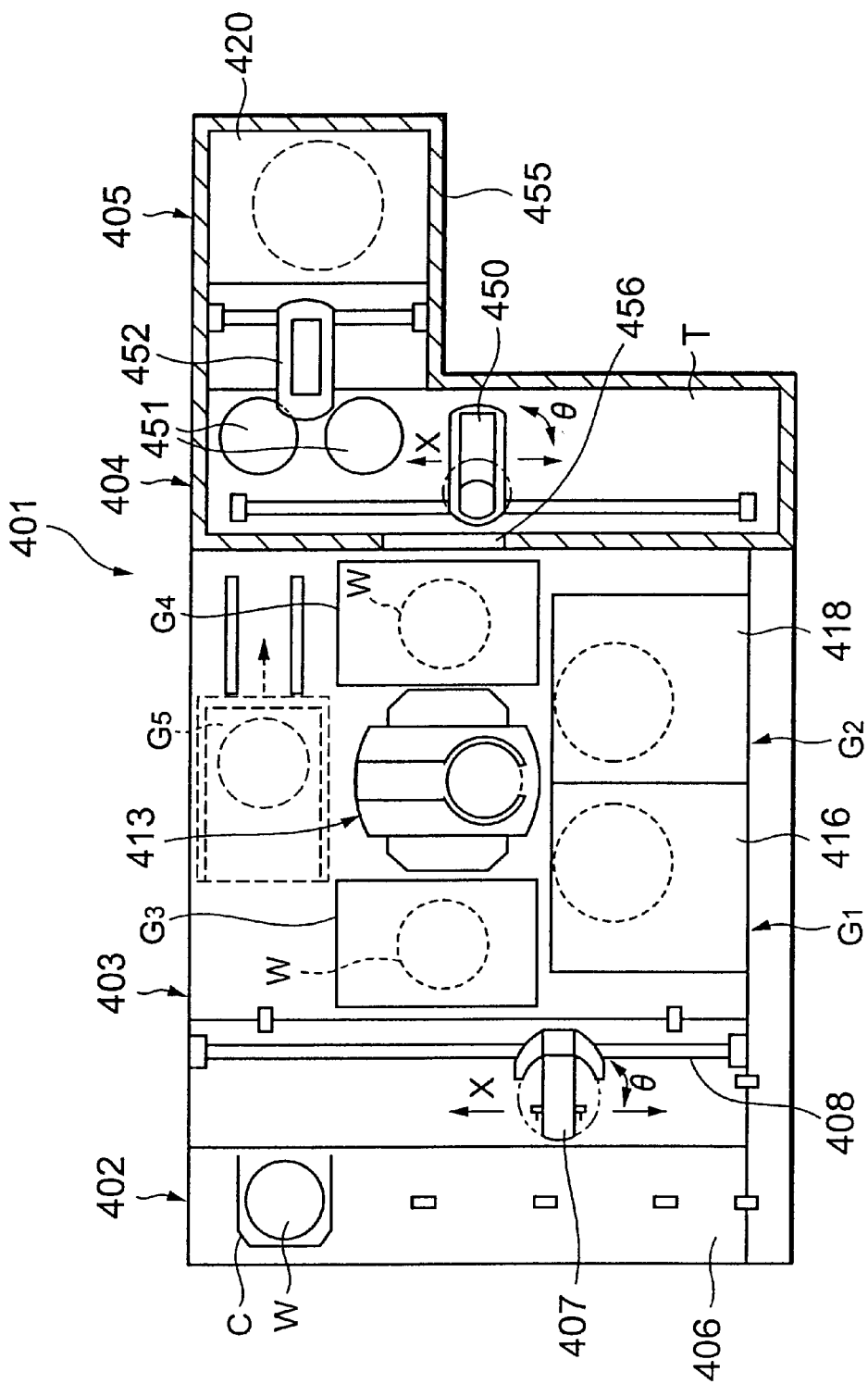
FIG. 1 is a plane view of a film forming system according to a first embodiment.
Figure 2:
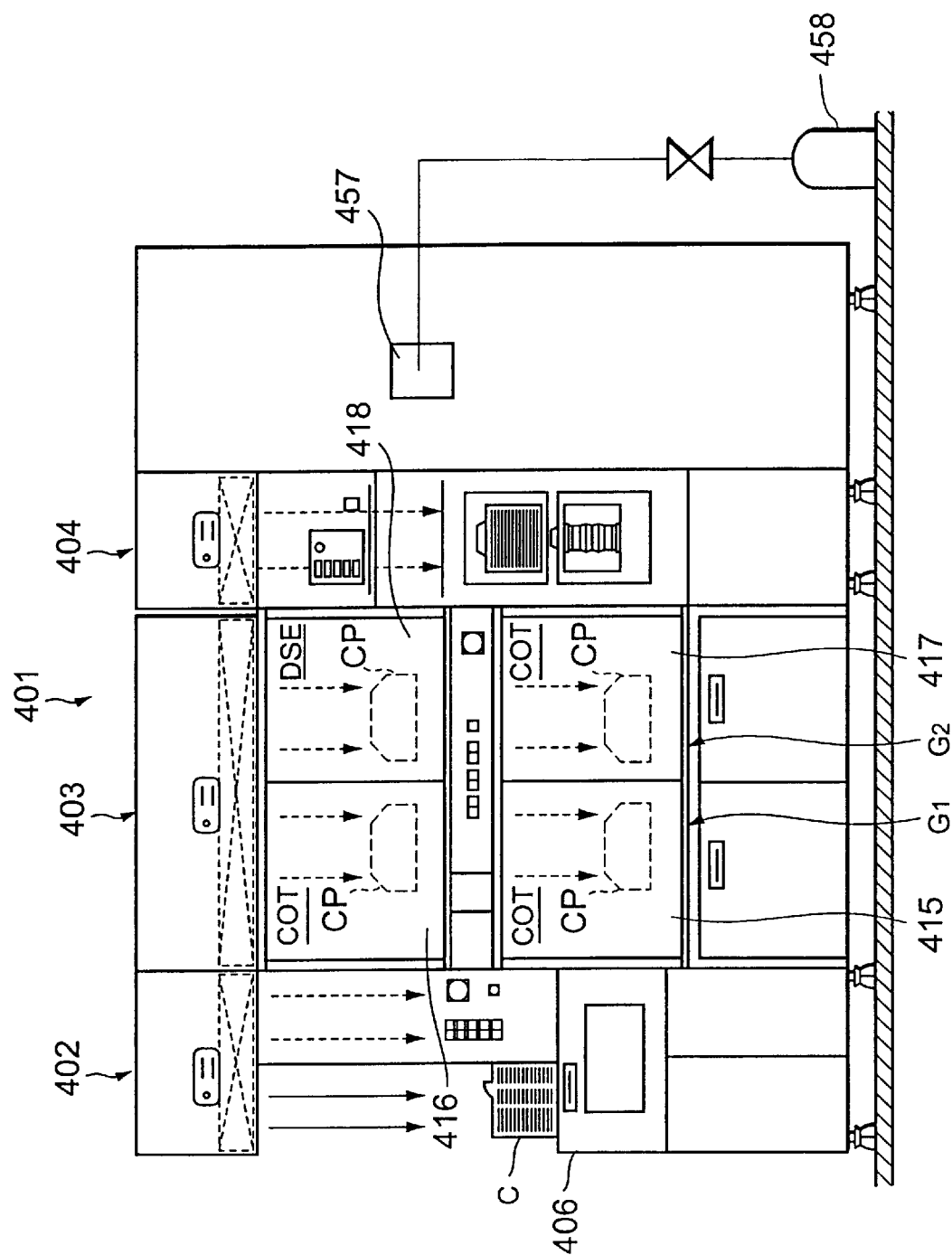
FIG. 2 is a side view of the film forming system in FIG. 1.
Figure 3:
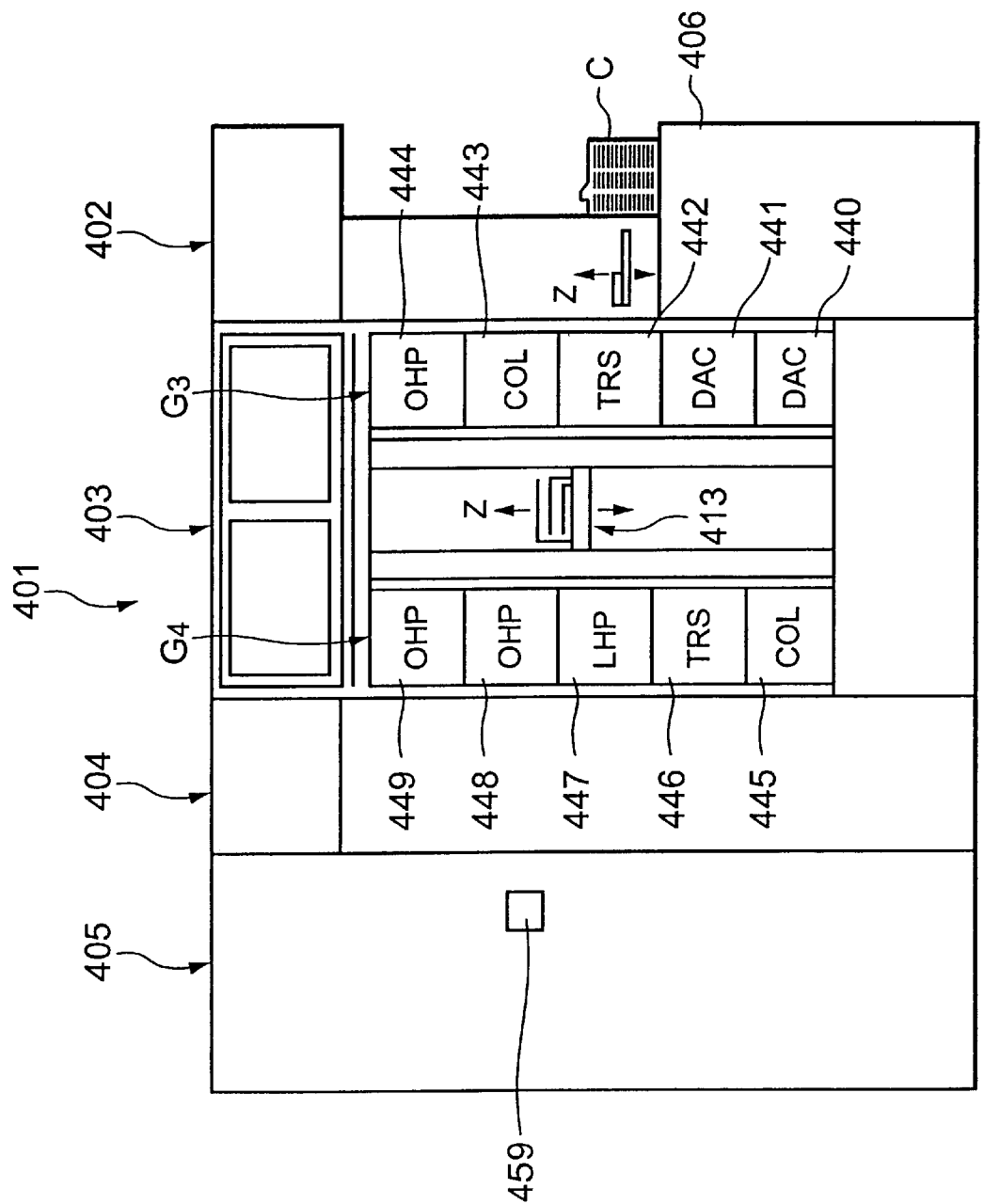
FIG. 3 is another side view of the film forming system in FIG. 1.

FIG. 1 is a plane view of a film forming system 401 for forming an insulating film as a film on a wafer W, FIG. 2 is a side view of the film forming system 401, and FIG. 3 is another side view of the film forming system 401.

The film forming system 401 has a structure, as shown in FIG. 1, in which a cassette station 402 for carrying, for example, 25 wafers W per cassette from/to the outside into/from the film forming system 401, and for carrying the wafers W into/out of a cassette C, a first processing station 403 in which various kinds of processing units for performing predetermined processing one by one in the process of forming an insulating film are multi-tiered, an interface section 404, provided adjacent to the first processing station 403, for delivering the wafer W and the like, and a second processing station 405 including an annealing furnace 420 for performing heat processing by batch processing as a second heater are integrally connected.

In the cassette station 402, a plurality of cassettes C are mountable in a line in an X-direction (in a vertical direction in FIG. 1) at predetermined positions on a cassette mounting table 406 which is a mounting section. A wafer transfer body 407 transportable in relation to the direction of arrangement of the cassettes (the X-direction) and the direction of arrangement of the wafers W housed in the cassettes C (a Z-direction; a vertical direction) is provided to be movable along a transfer path 408 so as to be selectively accessible to each cassette C.

The wafer transfer body 407 is structured to be accessible also to a delivery section 442 included in a third processing unit group G3 on the first processing station 403 side as will be described later.

In the first processing station 403, a main transfer device 413 is provided at the center thereof and various kinds of processing units are multi-tiered around the main transfer device 413 to form processing unit groups. In the film forming system 401, four processing unit groups G1, G2, G3, and G4 are arranged. The first and second processing unit groups G1 and G2 are disposed at one side of the film forming system 401, the third processing unit groups G3 is disposed adjacent to the cassette station 402, and the fourth processing unit group G4 is disposed adjacent to the interface section 404. Further, a fifth processing unit group G5 shown by a broken line as an option can be additionally disposed at the other side.

In the first processing unit group G1, as shown in FIG. 2, spinner-type processing units, for example, coating units (COT) 415 and 416 each for performing processing by applying a coating solution for forming an insulating film to the wafer W are two-tiered. In the second processing unit group G2, a coating unit (COT) 417 and an exchange-chemical coating unit (DSE) 418 for exchanging a solvent in the coating solution for another solvent are two-tiered.

In the third processing unit group G3, as shown in FIG. 3, two aging processing units (DAC) 440 and 441 for performing gelling processing for the wafer W, the delivery section (TRS) 442 for delivering the wafer W from/to the cassette station 402, a cooling unit (COL) 443 for performing cooling processing, a low-oxygen and high-temperature heat processing unit (OHP) 444 for performing heat processing for the wafer W, and the like are five-tiered, for example, from the bottom in order.

In the fourth processing unit group G4, for example, a cooling unit (COL) 445, a delivery section (TRS) 446 for delivering the wafer W from/to the interface section 404, a low-temperature heat processing unit (LHP) 447, two low-oxygen and high-temperature heat processing units (OHP) 448 and 449 each for vaporizing solvent components in the coating solution applied on the front face of the wafer W as a first heater, and the like are five-tiered, for example, from the bottom in order.

Next, in the interface section 404, a wafer transfer body 450 and mounting sections 451 each for mounting the wafer W before and after heat processing in the annealing furnace 420 thereon. The wafer transfer body 450 is structured to be movable in the X-direction (the vertical direction in FIG. 1) and the Z-direction (the vertical direction) and to be rotatable in a θ-direction (a rotational direction around the Z-axis) so as to be accessible to the delivery section 446 included in the fourth processing unit group G4 and the mounting sections 451.

The second processing station 405 is provided adjacent to the interface section 404 and includes the annealing furnace 420 and a transfer body 452 for transferring the wafer W from the mounting section 451 in the interface section 404 to the annealing furnace 420. Incidentally, the transfer body 452 is structured to be movable in the X-direction (the vertical direction in FIG. 1) and the Z-direction (the vertical direction) and to be rotatable in the θ-direction (the rotational direction around the Z-axis).

Figure 4:
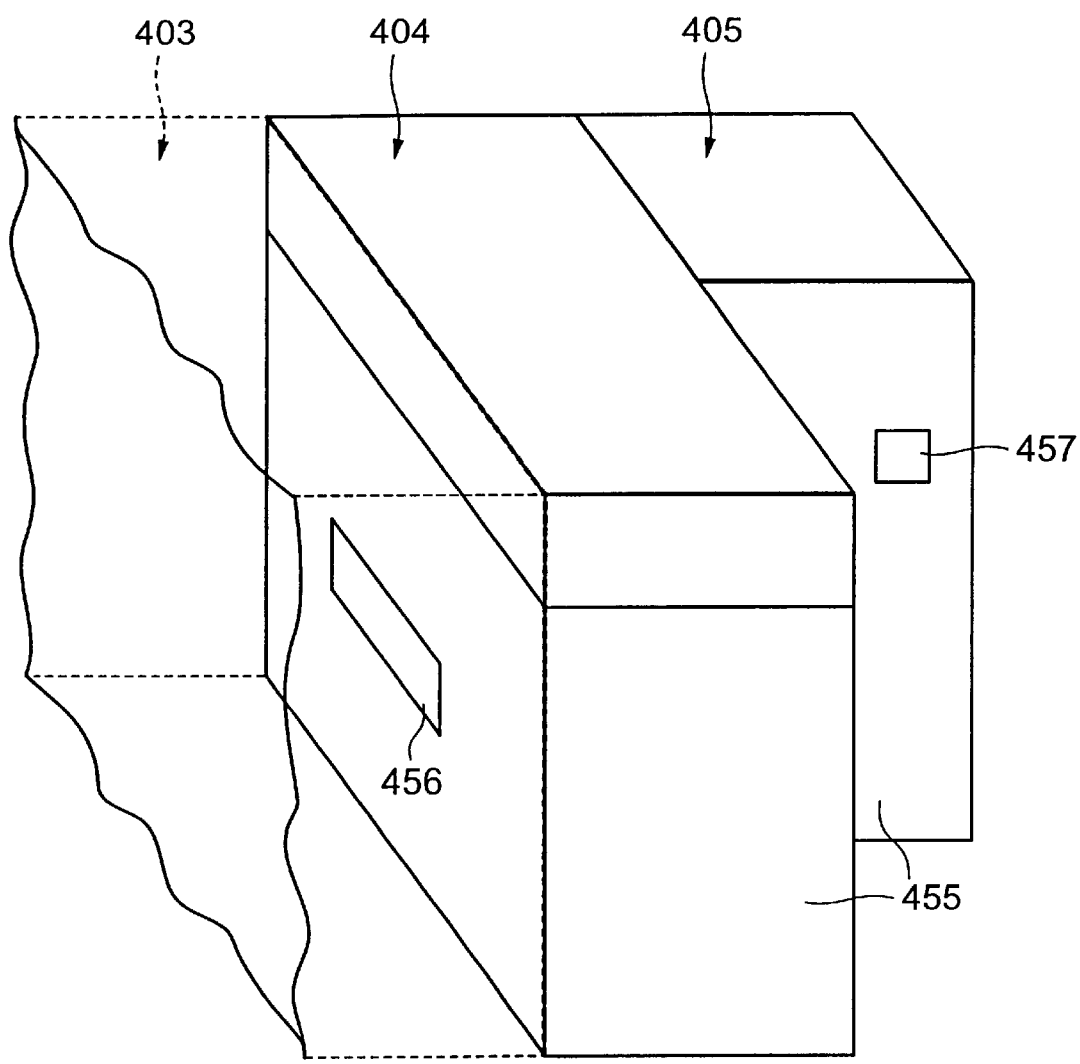
FIG. 4 is a perspective view of a principal portion showing a state of covering an interface section and a second processing station with panels in the film forming system according to the first embodiment.

Here, as shown in FIG. 4, a region where the interface section 404 and the second processing station 405 are disposed is covered with panels 455 as partition panels to form a space T. The panel 455 is provided with a carrying in/out port 460 into which the wafer W is carried into/out of the delivery section 446 of the first processing station 403. At the carrying in/out port 460, a shutter 456 which can really open and close the carrying in/out port 460 is provided facing the delivery section 446 of the fourth processing unit group G4. The panel 455 is provided with a supply port 457 for supplying a gas to bring in the space T to a low-oxygen atmosphere and the gas is supplied from a gas supply source 458 as shown in FIG. 2. Moreover, as shown in FIG. 3, a gas exhaust port 459 is provided at an appropriate position of the second processing station 405.

Here, the structure of the aforesaid low-oxygen and high-temperature heat processing unit (OHP) 449 for vaporizing the solvent components in the coating solution on the wafer W will be explained using FIG. 5.

Figure 5:
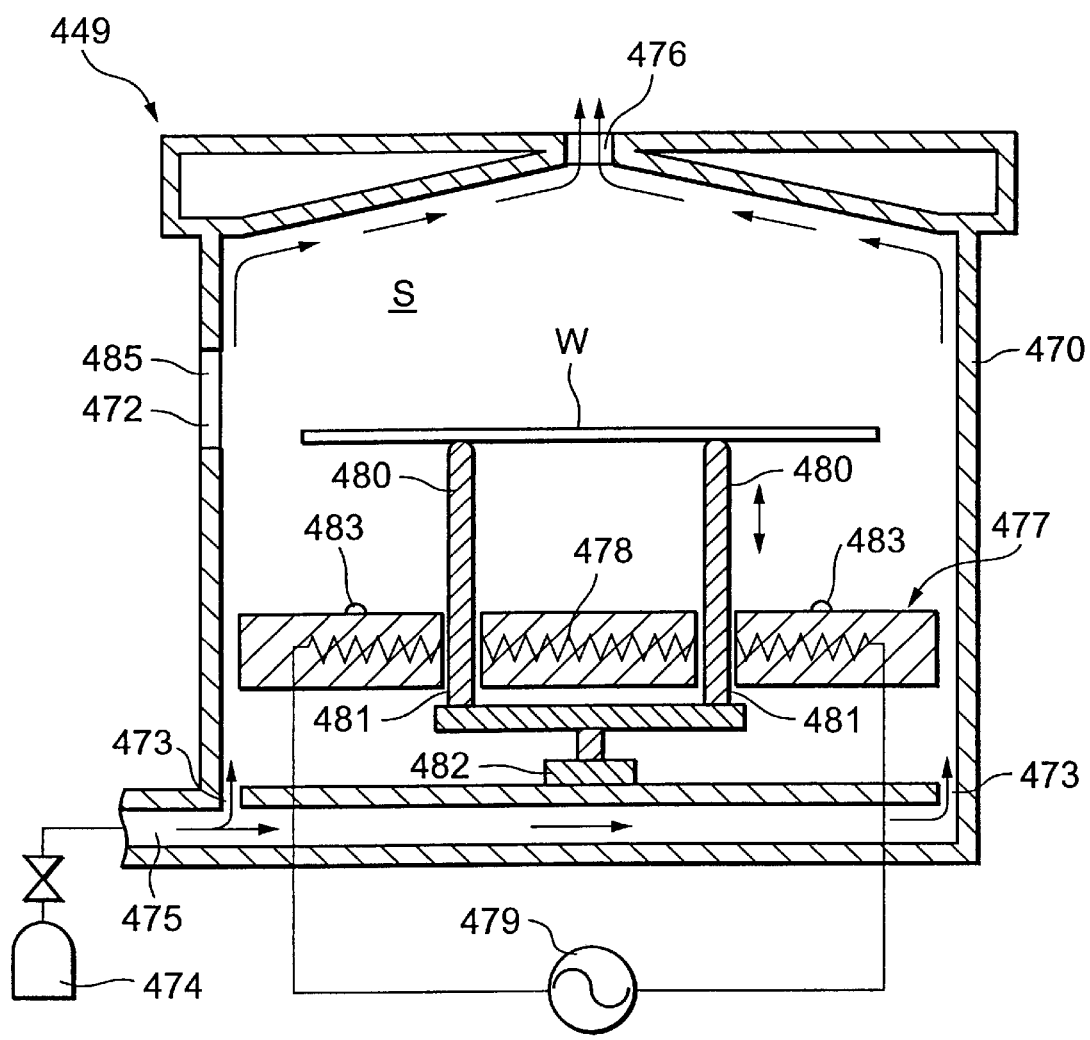
FIG. 5 is a sectional view of a low-oxygen and high-temperature heat processing unit in the film forming system according to the first embodiment.

As shown in FIG. 5, this low-oxygen and high-temperature heat processing unit (OHP) 449 is covered with a casing 470 to form a processing chamber S. A carrying in/out port 485 through which the wafer W is carried in/out is provided in the side face of the casing 470 and a shutter 472 which can freely open and close the carrying in/out port 485 is provided at the carrying in/out port 485. Moreover, at the bottom face of the casing 470, supply ports 473 for supplying, for example, nitrogen gas are provided so that nitrogen gas is supplied through the supply ports 473 from a gas supply source 474 via a supply passage 475. At the top face of the casing 470, an exhaust port 476 for exhausting the nitrogen gas or the like is provided. Accordingly, the nitrogen gas in the gas supply source 474 is supplied into the processing chamber S from the supply ports 473 to bring the atmosphere inside the processing chamber S to a low-oxygen atmosphere and further the nitrogen gas and impurities produced from the wafer W can be exhausted from the exhaust port 476.

In the casing 470, a thick and disc-shaped mounting table 477 for heating the wafer W is provided. A heater 478 which is a heat source during heating is embedded in the mounting table 477. The heater 478 generates heat by electric power supplied from a electric power source 479 which is provided outside the casing 470, and the wafer W on the mounting table 477 is heated by the generated heat.

Moreover, raising and lowering pins 480 for supporting, and raising and lowering the wafer W when the wafer W is carried into/out of the low-oxygen and high-temperature heat processing unit (OHP) 449 are provided through through-holes 481 which are provided in the mounting table 477 so as to freely protrude from the mounting table 477 and retract thereinto. Incidentally, the raising and lowering pins 480 are raised and lowered by a drive mechanism 482. Furthermore, proximity pins 483 for supporting the wafer W when the wafer W is mounted on the mounting table 477 are provided at three positions on the mounting table 477.

Figure 6:
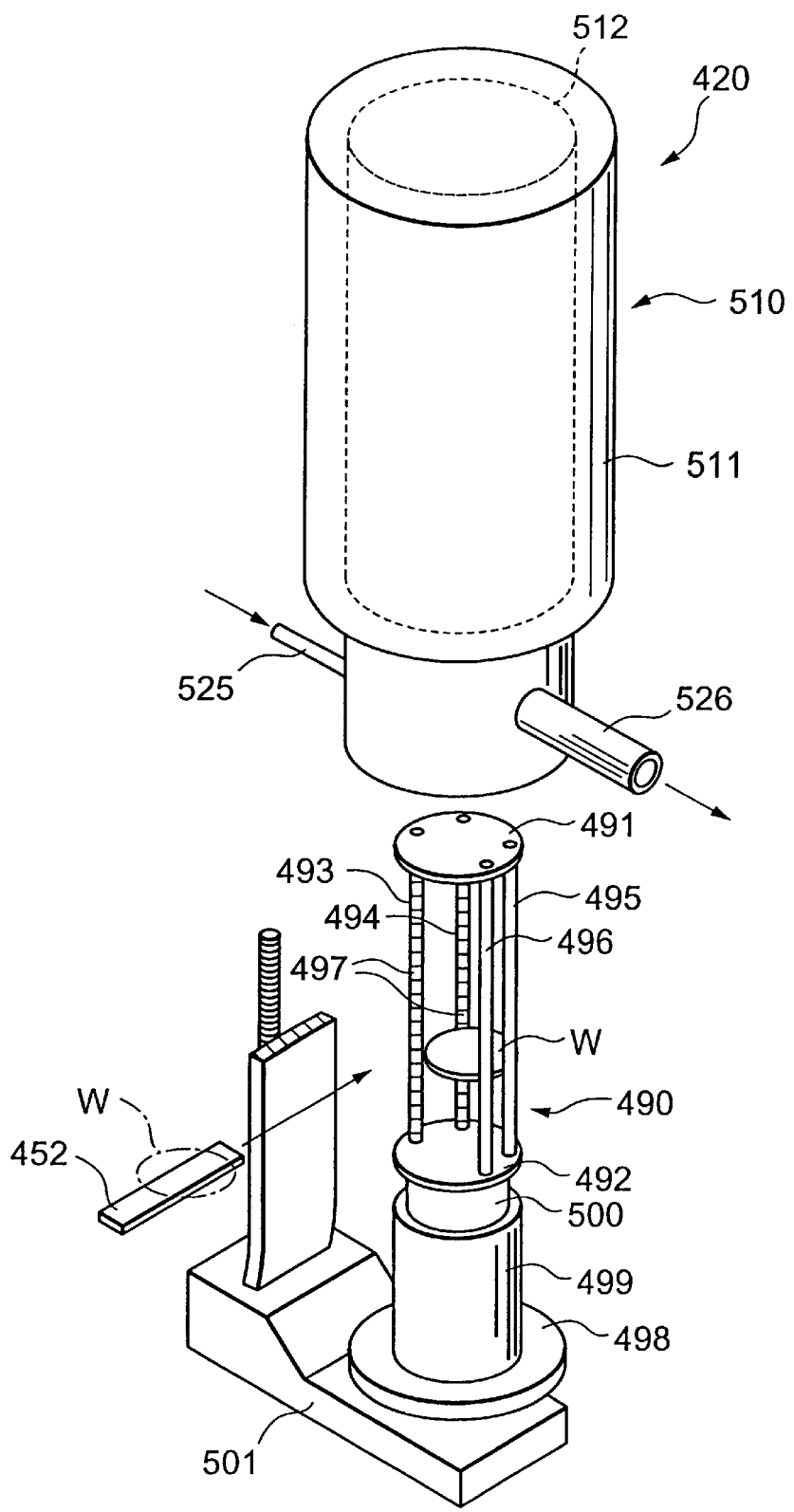
FIG. 6 is a perspective view showing an appearance of an annealing furnace in the film forming system according to the first embodiment.

Next, the structure of the annealing furnace 420 as the second heater for forming an insulating film on the wafer will be explained. As shown in FIG. 6, the annealing furnace 420 mainly includes a vertical type furnace 510 for actually performing heat processing for the wafer W and a ladder boat 490 for collectively loading a plurality of wafers W into the vertical type furnace 510.

The ladder boat 490 includes a disc-shaped top plate 491 and bottom plate 492 which are disposed vertically facing each other as shown in FIG. 6. Between the top plate 491 and the bottom plate 492, four columns 493, 494, 495, and 496 are provided. The wafer W is transferred from the mounting section 451 of the interface section 404 by the transfer body 452 and the peripheral portion of the wafer W is put into trench portions 497 formed in the surfaces of the respective columns 493, 494, 495, and 496, whereby the wafer W is loaded into the ladder boat 490.

Further, the ladder boat 490 is detachably attached on a pedestal (heat insulating mould) 499 made of quartz provided with a flange portion 498 made of, for example, stainless steel with a support member 500 therebetween. The pedestal 499 is mounted on a boat elevator 501 which can freely move up and down, so that the wafer W is loaded together with the ladder boat 490 into a reaction case 512 which will be described later in the vertical type furnace 510 by the ascent of the boat elevator 501.

On the other hand, the vertical type furnace 510 for performing predetermined insulating film forming processing is disposed in a vertical direction above the ladder boat 490. A casing 511 of the vertical type furnace 510 is approximately cylindrical in form of which the top face is closed and includes the reaction case 512 for actually performing heat processing for the wafer W therein. A heating unit not shown is disposed around the outer periphery of the reaction case 512. Moreover, a processing gas for forming an insulating film, for example, nitrogen gas is introduced into the reaction case 512 via a processing gas introducing pipe 525 and exhausted to the outside from an exhaust pipe 526 provided at the lower portion of the reaction case 512 after processing.

Figure 7:
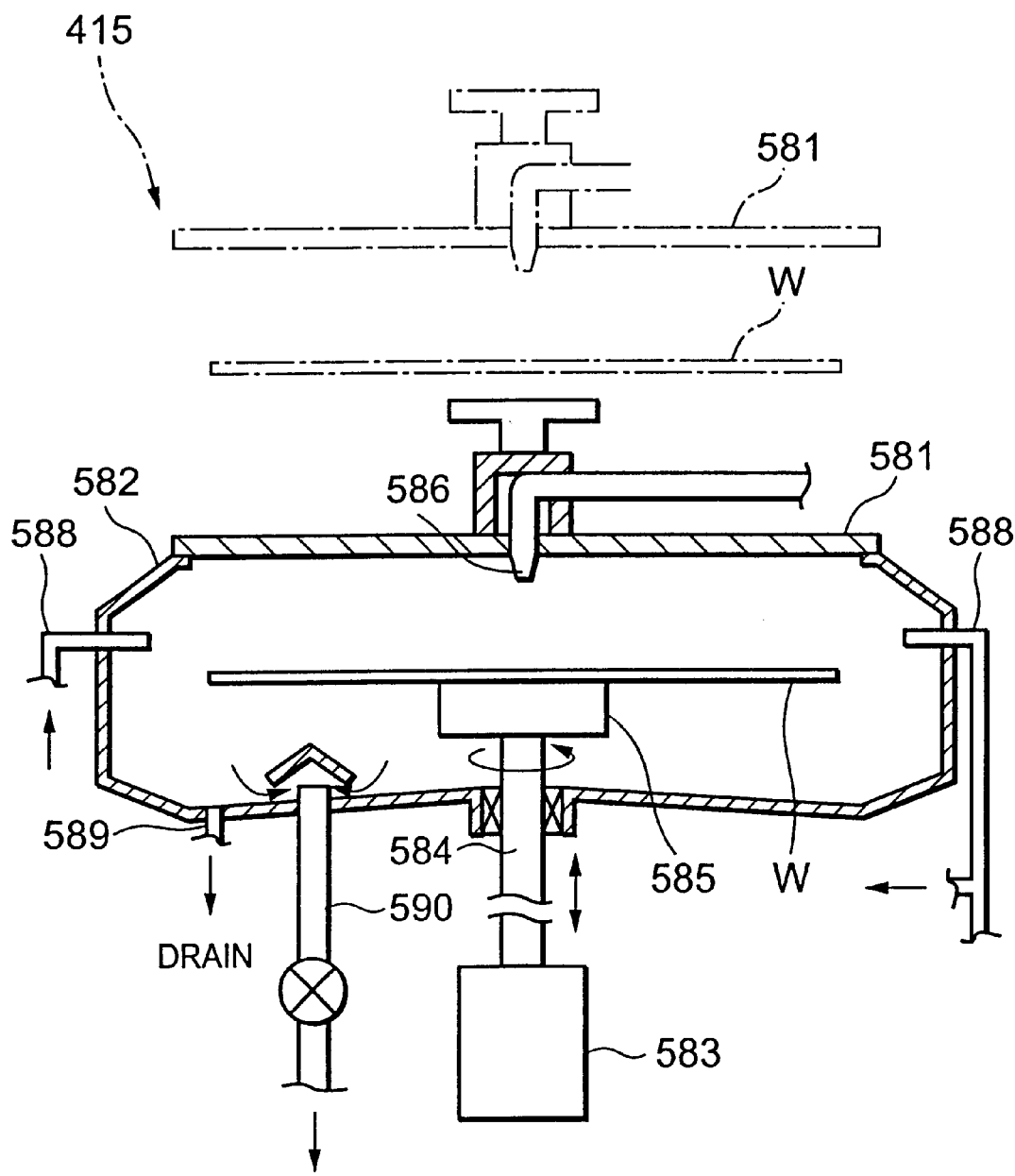
FIG. 7 is a sectional view showing a coating unit installed in the film forming system according to the first embodiment.

Next, the structure of the coating units (COT) 415 to 417 each for applying a coating solution for an insulating film onto the wafer W is explained using FIG. 7.

The coating unit (COT) 415 is a coater for applying a coating solution for an organic low dielectric constant film onto the wafer W and comprises a fixed cup 582 of which the top face is opened and closed by a cover 581, a rotation shaft 584 which is inserted from the bottom of the fixed cup 582 and can move up and down and rotate by means of a drive section 583, a vacuum chuck 585 which is a wafer holding portion provided at the top end of the rotation shaft 584, and a coating solution nozzle 586 provided combined with the cover 581, for supplying a coating solution onto the central portion of the wafer W. To the fixed cup 582 connected are solvent vapor supply pipes 588 for supplying vapor of a solvent used in the coating solution, for example, ethylene glycol and a drain pipe 589 and an exhaust pipe 590. Incidentally, the coating solution and the solvent used in this unit are supplied from a chemical chamber (not shown). In the chemical chamber, stored are chemicals except for chemicals such as ammonia and HMDS which exert bad influence on processing.

Incidentally, in order to form an organic insulating film by an SOD, there are a sol-gel process, a silk method, a speed film method, a fox method, and the like. When an insulating film is formed by the sol-gel process, a coating solution in which colloids of TEOS (tetraethylorthosilicate) are dispersed in an organic solvent is applied onto the front face of a wafer, and after the coating film is gelled, a solvent in the coating solution is exchanged for another solvent and thereafter dried to thereby obtain an insulating film. When an organic insulating film is formed by the silk method, the speed film method, and the fox method, a coating solution is applied onto a cooled wafer and the coating solution is cured by heat processing to thereby obtain an insulating film.

The coating unit 416 is used for the coating of an adhesion promoter which becomes necessary when adopting the silk method and the speed film method, and basically has the same structure as the coating unit 415.

The coating unit 417 is a unit for applying a coating solution for an inorganic insulating film for a hard mask made of, for example, $SiO_2$ onto an organic low dielectric constant film by the SOG (Spin On Glass) and basically has the same structure as the coating unit 415. In the SOG, a processing solution (SOG solution) in which a silanol compound, for example, $Si(OH)_4$ or the like and a solvent such as ethyl alcohol or the like are mixed is applied onto the wafer W. Heat processing is performed for the processing solution on the wafer W to thereby vaporize the solvent and allow polymerization reaction of the silanol compound to proceed, thereby forming an $SiO_2$ film.

The exchange-chemical coating unit (DSE) 418 is used in the case where the coating solution applied in the coating unit (COT) 415 is the type of coating solution to form into an organic insulating film by the sol-gel process. The exchange-chemical coating unit (DSE) 418 includes a spin chuck for rotating the wafer W while holding the wafer W horizontally and a cup provided to surround the wafer W on the chuck, and first exchanges water in the coating solution after aging processing for gelling for ethanol or the like and further exchanges the solvent in the coating film for heptane or the like.

Next, procedures for forming a layer insulating film and hard mask layers and for forming a trench wiring and a plug by a dual damascene method using the film forming system 401 structured as above will be explained with reference to FIG. 8.

First, a lower level wiring 702 is formed on the wafer W, and then an organic low dielectric constant film 703 is formed on the wafer W to cover the lower level wiring 702 as a first layer insulating film ((a) in FIG. 8). A hard mask layer 704 made of silicon oxide ($SiO_2$) is formed on the organic low dielectric constant film 703 ((b) in FIG. 8).

The organic low dielectric constant film 703 and the hard mask layer 704 are formed as follows by the aforesaid insulating film forming system.

Figure 8A:
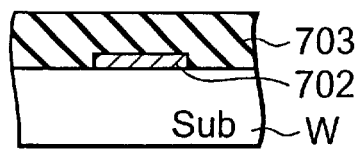
FIG. 8 is a view showing forming processes of trench wiring and a plug by a dual damascene method to which a film forming method according to the first embodiment is applied.

First, when the organic low dielectric constant film 703 is formed, in the case where the coating solution for the organic low dielectric constant film is applied by the silk method and the speed film method, the wafer W which has been taken out of the cassette in the cassette station 402 is transferred to the delivery section (TRS) 442. The wafer W is transferred from the delivery section (TRS) 442 to the cooling unit (COL) 443 for performing temperature control by the main transfer device 413. After being controlled at a predetermined temperature in the cooling unit (COL) 443, the wafer W is coated with an adhesion promoter in the coating unit (COT) 416 prior to a coating solution for the organic low dielectric constant film. Thereafter, the wafer W is subjected to baking in the low-temperature heat processing unit (LHP) 447 for low temperatures and cooled in the cooling unit (COL) 445, and then the coating solution for an organic low dielectric constant film is applied onto the wafer W in the coating unit (COT) 415. Thereafter, the wafer W is subjected to baking processing in the low-temperature heat processing unit (LHP) 447 for low temperatures and the low-oxygen and high-temperature heat processing unit (OHP) 449 for high temperatures. In the fox method, the wafer W is processed in the order of the cooling unit (COL) 443, the coating unit (COT) 415, the low-temperature heat processing unit (LHP) 447, and the low-oxygen and high temperature heat processing unit (OHP) 449 to complete processing up to and including baking. In the sol-gel process, the wafer W is processed in the order of the cooling unit (COL) 443, the coating unit (COT) 415, the aging processing unit (DAC) 441, the exchange-chemical coating unit (DSE) 418, the low-temperature heat processing unit (LHP) 447, and the low-oxygen and high-temperature heat processing unit (OHP) 449 to complete processing up to and including baking. As described above, the organic low dielectric constant film 703 is formed on the semiconductor wafer W on which the wiring 702 has been formed as shown in FIG. 8(a).

Next, after the wafer W is cooled at a predetermined temperature in any of the cooling units (COL), "Nanoglass" from Allied Signal, for example, is applied as a coating solution for forming a hard mask layer onto the organic low dielectric constant film 703 which has been formed on the wafer W by the coating unit (COT) 417. The wafer W coated with the coating solution is immediately transferred to the aging processing unit (DAC) 440 to be subjected to gelling processing. Thereafter, the wafer W is transferred to the exchange-chemical coating unit (DSE) 418, and processing of exchanging a solvent in the insulating film applied on the wafer W for another solvent is performed. The wafer W is then transferred to the low-oxygen and high-temperature heat processing unit (OHP) 449 to vaporize the solvent.

Here, operations of the low-oxygen and high-temperature heat processing unit (OHP) 449 is explained in detail.

First, the wafer W for which the previous processes have been completed is carried into the low-oxygen and high-temperature heat processing unit (OHP) 449 through the carrying in/out port 485 by means of the main transfer device 413. At this time, the raising and lowering pins 480 move up through the through-holes 481 by means of the drive mechanism 482 and wait at a predetermined position above the mounting table 477. The main transfer device 413 mounting the wafer W thereon moves to a position above the mounting table 477 and stops, and thereafter moves down to pass the wafer W to the raising and lowering pins 480. The main transfer device 413 which has passed the wafer W immediately retracts from the processing chamber S and the opening and closing shutter 472 is closed. Moreover, that the wafer W is supported on the raising and lowering pins 480 is recognized as a trigger, nitrogen gas in the gas supply source 474 is supplied from the supply ports 473 into the processing chamber S through the supply passage 475. In the state in which the wafer W is supported by the raising and lowering pins 480 above the mounting table 477, the nitrogen gas is supplied for a predetermined period of time so that the atmosphere in the processing chamber S is exchanged for a low-oxygen atmosphere.

After the processing chamber S has been brought to a low-oxygen atmosphere thoroughly, the raising and lowering pins 480 supporting the wafer W thereon move down by means of the drive mechanism 482, whereby the wafer W is mounted on the proximity pins 483 on the mounting table 477. The wafer W is subjected to heat processing by the mounting table 477 which is preheated at a predetermined temperature, for example, 300° C. heated by the heater 478 for a predetermined period of time.

After the completion of the heat processing, the wafer W is supported by the raising and lowering pins 480 which have moved up by means of the drive mechanism 482 and is moved up again. The raising and lowering pins 480 move up to a predetermined position above the mounting table 477 and stops, and the wafer W is passed to the main transfer device 413 which has entered into the casing 470 through the carrying in/out port 485. The main transfer device 413 which has received the wafer W retracts from the inside of the casing 470, and the opening and closing shutter 472 is closed again.

The wafer W which has been carried out of the low-oxygen and high-temperature heat processing unit (OHP) 449 is transferred to the cooling unit 445 and subjected to cooling processing. Thereafter the wafer W is transferred to the delivery section (TRS) 446 and waits until the wafer transfer body 450 of the interface section 404 gets access thereto.

Next, the wafer transfer body 450 of the interfaces section 404 passes through the carrying in/out port 460 provided in the panel 455 as a partition panel and receives the wafer W in the delivery section 446. At this time, the atmosphere in the space T formed by the panels 455 has been brought to a low-oxygen atmosphere with nitrogen gas that is an inert gas supplied from the gas supply source 458. Moreover, the space T is always maintained under positive pressure with respect to the external atmosphere in order not to allow the surrounding air to enter thereinto even when the opening and closing shutter 456 is opened. Thereafter, the wafer transfer body 450 which has received the wafer W transfers the wafer W to the mounting section 451 in the interface section 404 and mounts a plurality of the wafers W collectively.

The transfer body 452 of the second processing station receives the wafers W on the mounting section 451 and transfers the wafers W to the annealing furnace 420 and loads the wafers W into the ladder boat 490 in the annealing furnace 420.

Next, operations of the annealing furnace 420 will be explained in detail. The temperature in the reaction case 512 is first raised up to, for example, about 420° C. by a heater not shown and nitrogen gas is introduced from the processing gas introducing pipe 525 to bring the inside of the reaction case 512 to a nitrogen gas atmosphere. Subsequently, after the wafers W are loaded into the ladder boat 490 by the transfer body 452, the boat elevator 501 is moved up to raise the ladder boat 490 to a position where the flange portion 498 of the pedestal 499 intimately contacts with a flange not shown at the lower end portion of the reaction case 512 so as to load the wafers W into the reaction case 512.

Figure 8B:
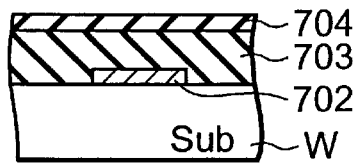
Figure 8C:
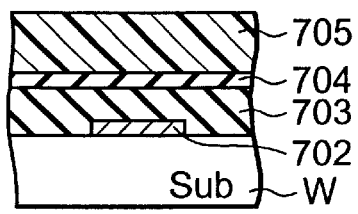
Figure 8D:
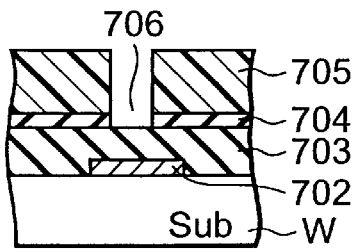

Subsequently, the inside of the reaction case 512 is heated up to a predetermined processing temperature, for example, 420° C. Then, while nitrogen gas is introduced into the reaction case 512 from the processing gas introducing pipe 525 and air is exhausted from the exhaust pipe 526, the inside of the reaction case 512 is maintained under, for example, a normal pressure and heat processing is performed for a predetermined period of time, whereby the hard mask layer 704 with a predetermined thickness is formed. Through the performance of cure processing as above, the organic low dielectric constant film 703 and the hard mask layer 704 are collectively cured and formed on the wafer W as shown in FIG. 8(b). It should be noted that when the organic low dielectric constant film 703 is formed by the sol-gel process, cure processing in the annealing furnace 420 is processing for the hard mask layer 704 because curing has been completed by the baking and thus further cure processing is unnecessary.

After the formation has been completed up to and including the hard mask layer 704 as described above, further a resist film 705 is formed on the hard mask layer 704 ((c) in FIG. 8). Then, the resist film 705 is exposed and developed by the photolithography process to thereby form a predetermined pattern. The hard mask layer 704 is patterned by etching with the above pattern as a mask, thereby providing an opening portion 706 which is smaller than the lower level wiring 702 in width in an area where the lower level wiring 702 and the trench wiring which will be formed later are connected (FIG. 8(d)).

Figure 8E:
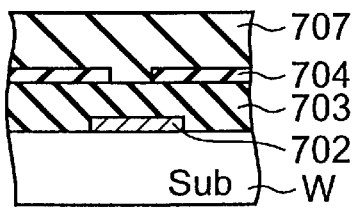
Figure 8F:
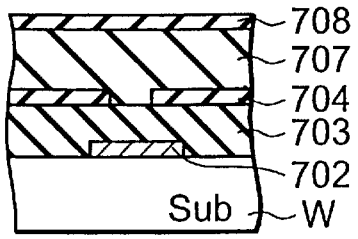

After the resist film 705 is removed, an organic low dielectric constant film 707 is formed as a second layer insulating film on the hard mask layer 704 and in the opening portion 706 (FIG. 8(e)). Further, a hard mask layer 708 made of, for example, $SiO_2$ film is formed on the organic low dielectric constant film 707 (FIG. 8(f)). These organic low dielectric constant film 707 and hard mask layer 708 are film-formed by the aforesaid film forming system in the exact same procedures as the aforesaid organic low dielectric constant film 703 and hard mask layer 704.

Figure 8G:
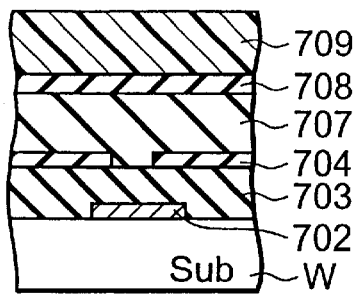
Figure 8H:
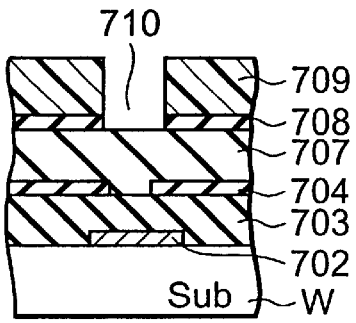

After the formation has been completed up to and including the hard mask layer 708 as described above, further a photoresist film 709 is formed on the hard mask layer 708 (FIG. 8(g)). Then, the photoresist film 709 is exposed and developed by the photolithography process to thereby form a predetermined pattern. The hard mask layer 708 is etched with the above pattern as a mask, thereby forming an opening portion 710 in the hard mask layer 708(FIG. 8(h)).

Figure 8I:
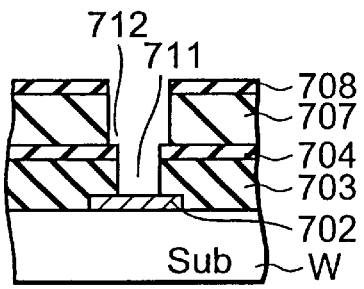
Figure 8J:
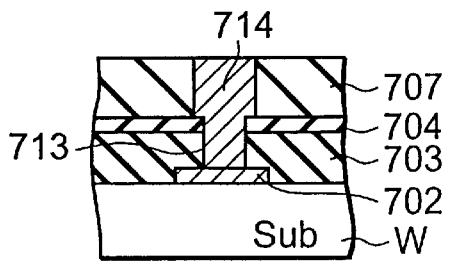

The organic low dielectric constant films 703 and 707 are etched using the hard mask layer 708 which is patterned as described above as an etching mask and the hard mask layer 704 as an etching stopper film (FIG. 8(i)). Thereby, trench portions 711 and 712 are formed in the organic low dielectric constant films 703 and 707 respectively.

A barrier metal layer (not shown) is formed on the inside walls of these trench portions 711 and 712. Thereafter, a conductive material is buried in the trench portions using the CVD method or the like and further polishing is performed by the CMP method to selectively leave only the conductive material in the trench portions to thereby complete a conductive portion including a plug 713 and trench wiring 714 (FIG. 8(j)).

The outline of the flow of this processing will be explained with reference to FIG. 9 while compared with the conventional one.

Conventionally, as shown in (a), an organic low dielectric constant film (Lowk 1) is film-formed as a first layer insulating film by a coating technique and thereafter a first hard mask layer (hard mask 1) is formed in a CVD apparatus and subjected to the photolithography and etching. Thereafter, an organic low dielectric constant film (Lowk 2) is film-formed as a second layer insulating film by the SOD technique and a second hard mask layer (hard mask 2) is formed in the CVD apparatus and subjected to the photolithography and etching. Whereas, in the present invention, an organic low dielectric constant film (Lowk 1) as a first layer insulating film and a first hard mask layer (hard mask 1) are collectively formed by the coating technique and subjected to the photolithography and etching. Thereafter, an organic low dielectric constant film (Lowk 2) as a second layer insulating film and a second hard mask layer (hard mask 2) are collectively formed by the coating technique and subjected to the photolithography and etching.

As described above, in contrast to the conventional process, the organic low dielectric constant film as a layer insulating film and the hard mask layer are each formed by applying a coating solution, thereby collectively forming a two-layered structure of the organic low dielectric constant film and the hard mask layer without the CVD apparatus, resulting in simplification of these forming processes in the present invention. Furthermore, since the two-layered structure is formed sequentially by one aforesaid film forming system, it is unnecessary to transfer the wafer to another apparatus, so that the film-forming processing can be remarkably simplified and thus the organic low dielectric constant film and the hard mask layer can be very speedily formed.

Moreover, according to the aforesaid embodiment, a predetermined heat processing is not performed until the inside of the processing chamber S is exchanged for nitrogen gas and brought to a thorough low-oxygen atmosphere in the low-oxygen and high-temperature heat processing unit 449 for vaporizing the solvent in the coating solution, thereby preventing oxidation of the coating film on the wafer W in reaction with oxygen. Furthermore, the atmosphere in the area of the interface section 404 and the second processing station 405 is isolated from that in other areas by the panels 455 to form the space T. The space T is held in a low-oxygen atmosphere with nitrogen gas which is an inert gas, thereby preventing the coating film on the wafer W which is transferred into the space T from being oxidized in reaction with oxygen. Consequently, oxidation of the coating film on the wafer W can be retarded in the period before the heat processing in the annealing furnace 420 and the processing in the annealing furnace 420 is properly performed, thereby decreasing insufficient insulation and the like and improving yields.

Further, the panel 455 is provided with the opening and closing shutter 456 which can be freely opened and closed and the opening and closing shutter 456 is closed except when the wafer W is carried in/out, thereby retarding variations in oxygen concentration in the space T. Moreover, the gas amount required for maintaining the space T in the low-oxygen atmosphere can be reduced, which is economical.

In the aforesaid embodiment, in the low-oxygen and high-temperature heat processing unit 449 for vaporizing the solvent components in the coating film, nitrogen gas as an inert gas is supplied and air is exhausted from the top of the casing 470 in order to make a low-oxygen atmosphere. However, it is also suitable that a vacuum pump is used as an exhaust means for reducing pressure to bring the inside of the low-oxygen and high-temperature heat processing unit 449 to a state of reduced pressure in order to make a low-oxygen atmosphere. In this case, the casing 470 is structured to be able to maintain airtightness.

Next, the film forming system having another structure will be explained as a second embodiment. The second embodiment is different from the first embodiment in positional relations between the processing station in which various kinds of processing units, such as a coating unit and the like, each for performing predetermined processing in the process of forming an insulating film are arranged, the processing station in which the annealing furnace is disposed, and the interface section in which a wafer W is delivered between these processing stations.

Figure 10:
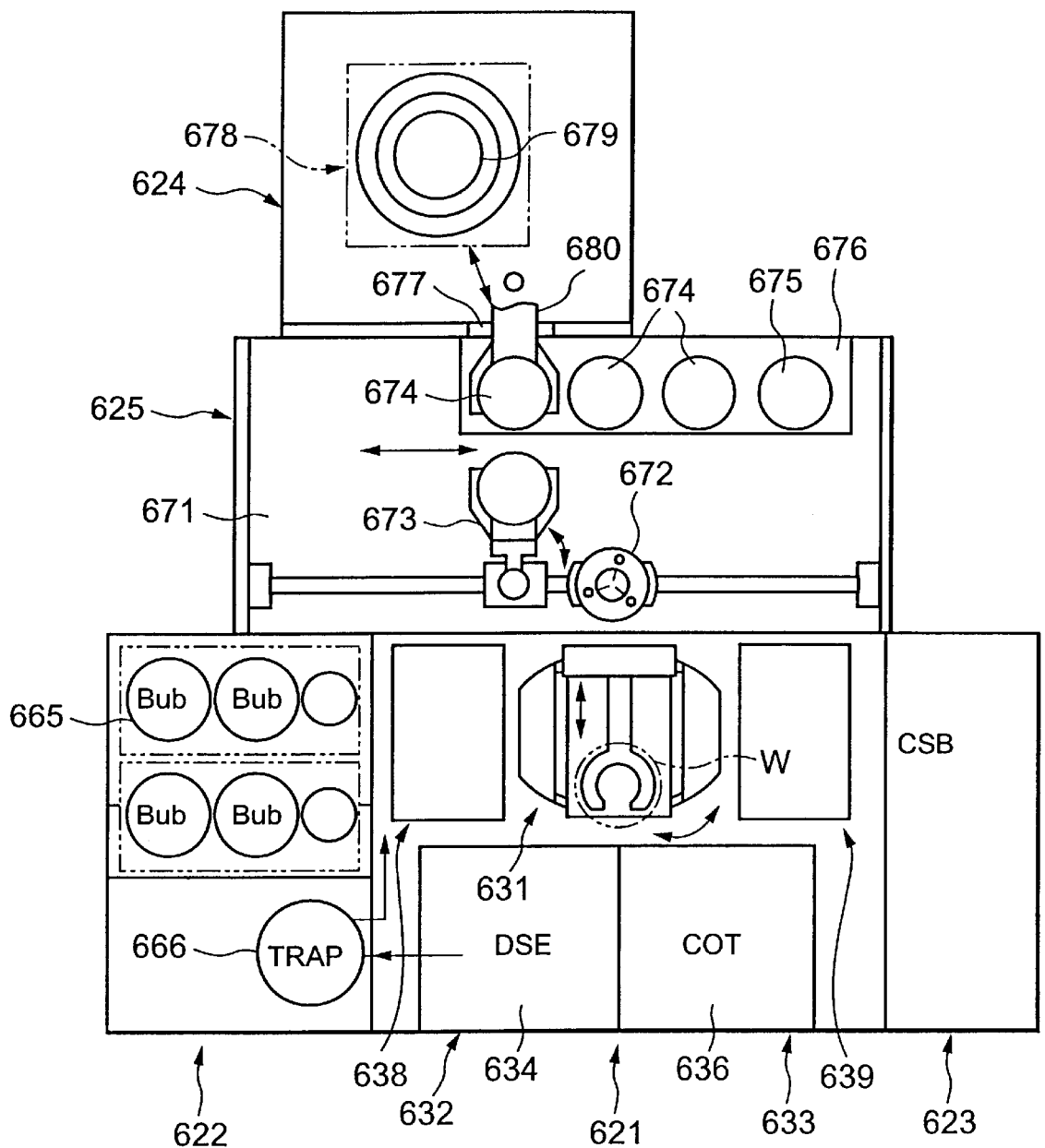
FIG. 10 is a plane view showing a film forming system according to a second embodiment.
Figure 11:
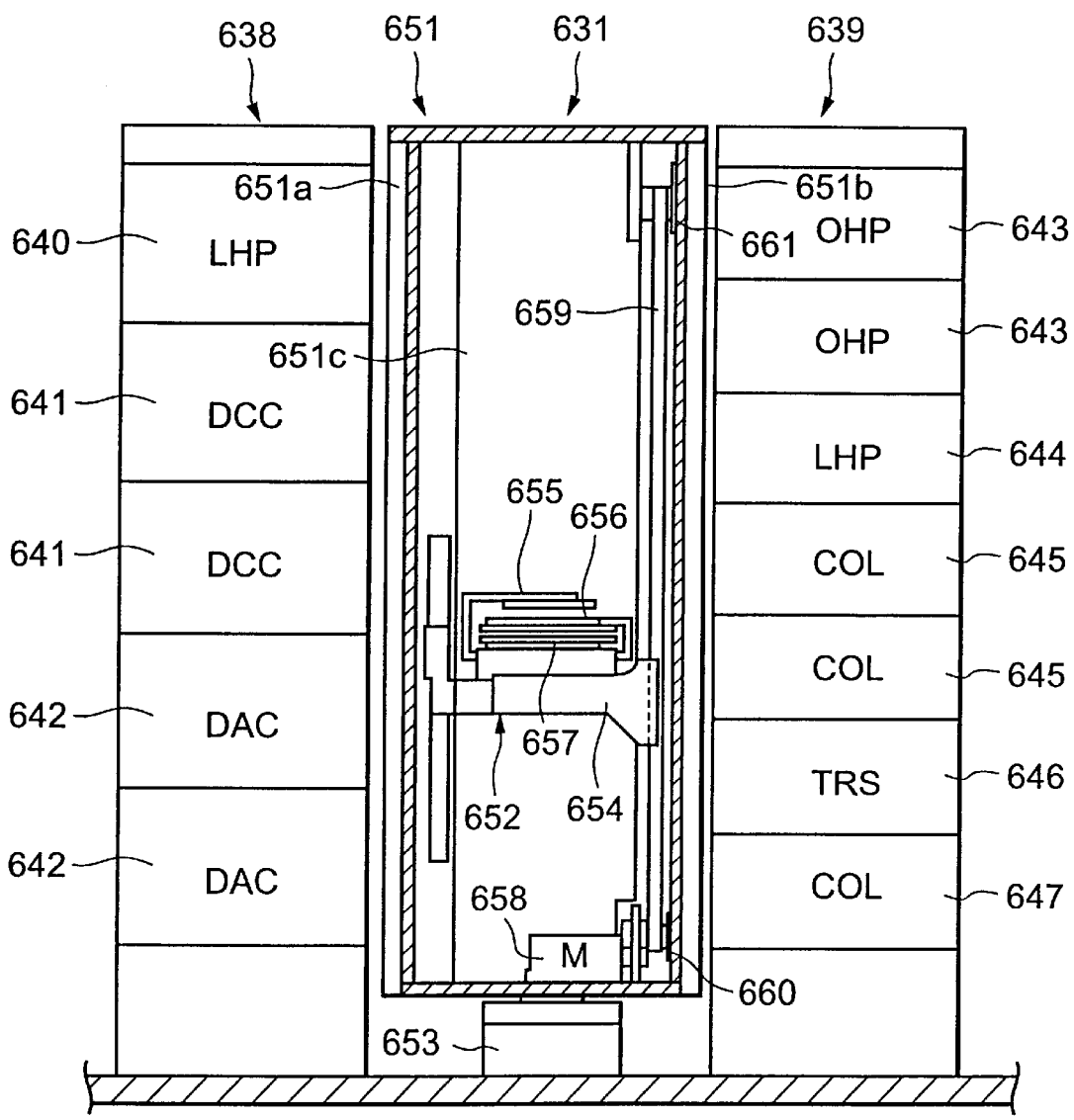
FIG. 11 is a side view showing the film forming system according to the second embodiment.
Figure 12:
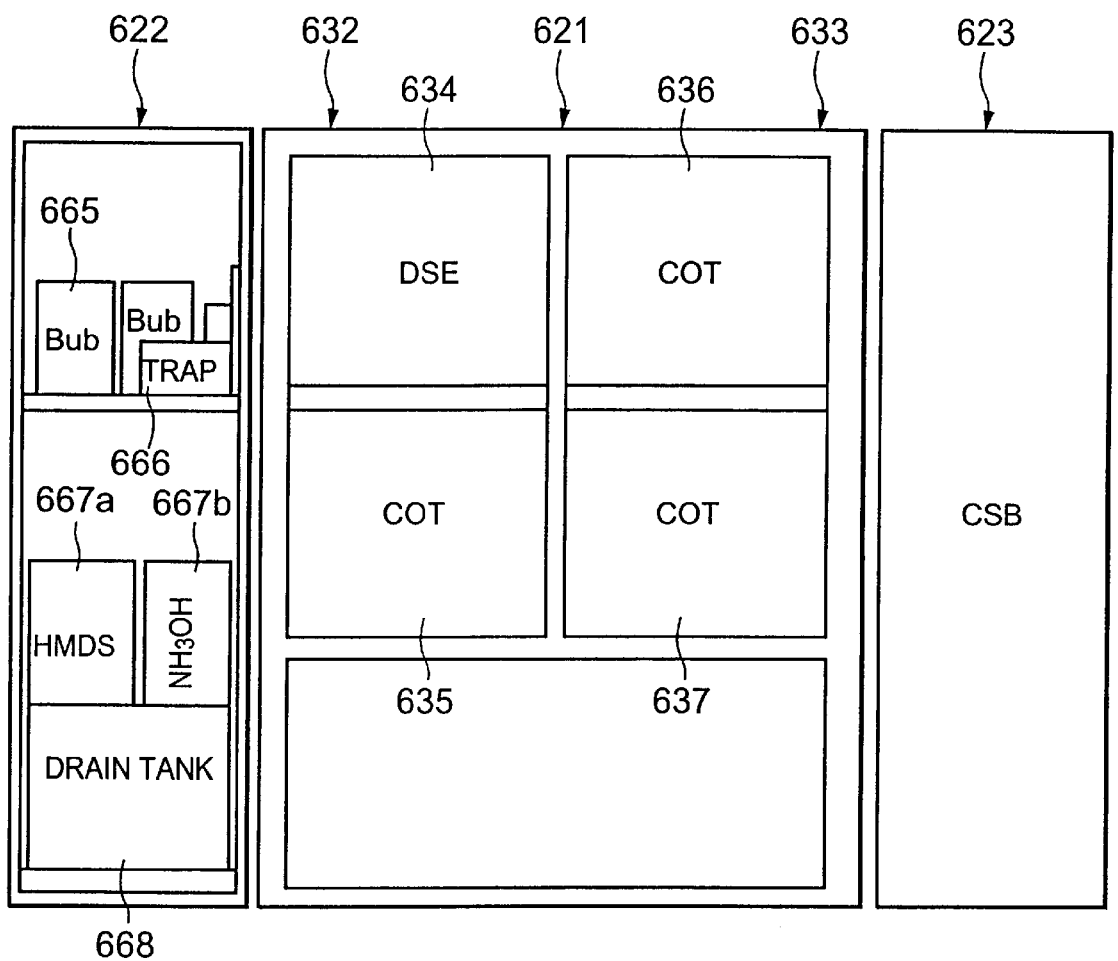
FIG. 12 is a side view showing two processing unit groups in each of which a plurality of processing units are multi-tiered and a side cabinet which are placed in the film forming system according to the second embodiment.

FIG. 10 is a plane view showing the film forming system according to the second embodiment, FIG. 11 is a side view of the film forming system shown in FIG. 10, and FIG. 12 is a side view showing two processing unit groups placed in the film forming system shown in FIG. 10.

This film forming system comprises a coating processing section 621 as a processing station in which various kinds of processing units each for performing predetermined processing in the process of forming an insulating film are multi-tiered, a side cabinet (chemical section) 622, a cassette station (CSB) 623 for mounting cassettes housing a plurality of semiconductor wafers (hereinafter, referred to as only wafers) W and carrying the wafer W in/out, a cure processing section 624 in which an annealing furnace for performing cure processing for the plurality of wafers W which have been coated with a coating solution by batch processing is disposed, and an interface section 625 for delivering the wafer W between the coating processing section 621 and the cure processing section 624.

The coating processing section 621 includes a wafer transfer mechanism 631 near the central portion thereof as shown in FIG. 10 and FIG. 11, and all processing units are disposed around the wafer transfer mechanism 631. At the lower side of the coating processing section 621 in FIG. 10, two processing unit groups 632 and 633 in each of which two processing units are tiered are provided. The processing unit group 632 includes an exchange-chemical coating unit (DSE) 634 and a first coating unit (COT) 635 from the top in order. The processing unit group 633 includes a second coating unit (COT) 636 and a third coating unit (COT) 637. Incidentally, a chemical chamber (not shown) containing chemicals and the like is provided in the coating processing section 621.

On both sides of the wafer transfer mechanism 631, processing unit groups 638 and 639 in each of which a plurality of processing units are multi-tiered are provided. The processing unit group 638 on the left hand side is so structured that a low-temperature heat processing unit (LHP) 640 for low temperatures, two low-oxygen curing and cooling processing units (DDC) (Dielectric Oxygen Density Controlled Cure and Cooling-off) processing units 641, and two aging units (DAC) 642 are tiered in order from the top side as shown in FIG. 11. The processing unit group 639 on the right hand side is so structured that two low-oxygen and high-temperature heat processing units (OHP) 643 for high temperatures, a low-temperature heat processing unit (LHP) 644 for low temperatures, two cooling units (COL) 645, a delivery section (TRS) 646, and a cooling unit (COL) 647 are tiered in order from the top side.

The aforesaid first coating unit (COT) 635 is a unit for applying a coating solution for an organic low dielectric constant film used as a layer insulating film onto a wafer W, and has the same structure as the coating unit (COT) 415 in the aforesaid first embodiment.

The second coating unit (COT) 636 is used for applying an adhesion promoter which becomes necessary when adopting the silk method and the speed film method, and basically has the same structure as the first coating unit (COT) 635.

The third coating unit (COT) 637 is used for applying a coating solution for a hard mask made of, for example, $SiO_2$ onto the organic low dielectric constant film by the SOG (Spin On Glass), and also basically has the same structure as the first coating unit (COT) 635. In the SOG, a processing solution (SOG solution) in which a silanol compound, for example, $Si(OH)_4$ or the like and a solvent such as ethyl alcohol or the like are mixed is applied onto the wafer W. Heat processing is performed for the processing solution on the wafer W to thereby vaporize the solvent and allow polymerization reaction of the silanol compound to proceed, thereby forming an $SiO_2$ film.

The exchange-chemical coating unit (DSE) 634 is used in the case where the coating solution applied in the first coating unit (SCT) 635 is the type of coating solution to form into an organic insulating film by the sol-gel process. The exchange-chemical coating unit (DSE) 634 includes a spin chuck for rotating the wafer W while holding the wafer W horizontally and a cup provided to surround the wafer W on the chuck, and first exchanges water in the coating film after aging processing for gelling which will be described later for ethanol or the like and further exchanges the solvent in the coating film for heptane or the like.

The aging processing unit (DAC) 642 included in the processing unit group 638 has a hot plate containing a heater in an enclosed processing chamber. Ammonia is vaporized by a bubbler 665 or the like in the side cabinet 622 and supplied into the processing chamber, and exhaust air is trapped by a drain tank 668 in the side cabinet 622. The aging processing unit (DAC) is used for condensation-polymerizing and hydrolyzing TEOS (tetraethylorthsilicate) to gel a coating film when forming an organic low dielectric constant film by the sol-gel process.

The low-oxygen and high-temperature heat processing unit (OHP) for high temperatures and the low-temperature heat processing unit (LHP) for low temperatures included in the processing unit groups 6:38 and 639 are units each for mounting the wafer W on a hot plate which is set at a predetermined temperature or bringing the wafer W close to the hot plate to thereby bake the wafer W which has been coated with a coating solution. The cooling unit (COL) is a unit for mounting the wafer W on a cooling apparatus which is set at a predetermined temperature or bringing the wafer W close to the cooling apparatus to thereby cool the wafer W after baking. Further, the delivery section (TRS) 646 is a unit including a wafer mounting table, for delivering a wafer to/from the cassette station (CSB) 623. Incidentally, the delivery section (TRS) 646 can additionally have a function of a cooling apparatus by controlling the mounting table at a predetermined temperature.

The low-oxygen curing and cooling processing unit 641 included in the processing unit group 638 is a unit for performing heat processing and cooling processing for the wafer W on which the coating film is formed by batch processing in a low oxygen concentration atmosphere to cure the coating film. The low-oxygen curing and cooling processing unit 641 is used for the cure of the coating film when forming an organic layer insulating film by the silk method, the speed film method, or the fox method, but this unit needs not be used when forming a coating film by the sol-gel process. This low-oxygen curing and cooling processing unit 641 is used when the curing temperature is relatively low, and when the curing temperature is not less than 470° C., a vertical type annealing furnace 678 of the cure processing section 624 is used.

The wafer transfer mechanism 631, as shown in FIG. 11, extends in the vertical direction and includes a cylindrical supporter 651 having vertical walls 651a and 651b and a side opening 651c between the side walls 651a and 651b and a wafer transfer body 652 which is provided inside the cylindrical supporter 651 to be ascendable and descendable in the vertical direction (the Z-direction) along the cylindrical supporter 651. The cylindrical supporter 651 is rotatable by rotational driving force of a motor 653 and the wafer transfer body 652 is also rotated integrally with the cylindrical supporter 651. The wafer transfer body 652 includes a transfer base 654 and three tweezers 655, 656, and 657 movable back and forth along the transfer base 654, and these tweezers 655, 656, and 657 each have a size capable of passing through the side opening 651c of the cylindrical supporter 651. These tweezers 655, 656, and 657 can individually move forth and back by means of the motor embedded in the transfer base 654 and a belt mechanism. The wafer transfer body 652 is moved up and down by driving a belt 659 by a motor 658. Incidentally, a numeral 660 indicates a drive pulley and a numeral 661 indicates a slave pulley.

The side cabinet 622 is provided at a position adjacent to the coating processing section 621 isolated from the coating processing section 621, and includes the bubbler 665 for supplying chemicals and a mist trap (TRAP) 666 for performing gas-liquid separation for gas-liquid mixed flow and discharging exhaust gas on the upper tier thereof and an HMDS tank 667a, an ammonia tank 667b, and the drain tank 668 on the lower tier thereof.

Since the side cabinet 622 is structured as above, when ammonia is supplied to the aging processing unit (DAC) 642, ammonia is filled in the bubbler 665 from the ammonia tank 667b and the ammonia is bubbled by the bubbler 665 to be vaporized and supplied to the aging processing unit (DAC) 642. When HMDS is supplied to the exchange-chemical coating unit (COT) 634, HMDS is supplied directly from the HMDS tank 667a.

Moreover, exhaust air from the aging processing unit (DAC) 642 is trapped by the drain tank 668 in the side cabinet 622. Furthermore, exhaust air containing liquid from the exchange-chemical coating unit (COT) 634 is subjected to gas-liquid separation by the mist trap 666 in the cabinet 622 and waste liquid is discharged to the drain tank 668.

The aging processing unit (DAC) 642 and the exchange-chemical coating unit (DSE) 634 which respectively need ammonia and HMDS supplied from the side cabinet 622 are provided adjacent to the side cabinet 622, thereby achieving abbreviation of a chemical supply system.

In the interface section 625, a positioning mechanism 672 for receiving the wafer W transferred from the coating processing section 621 and positioning the wafer W, and a carrying in and carrying out mechanism 673 for receiving the wafer W from the positioning mechanism 672 and carrying in/out the wafer W to/from a wafer boat 674 are provided in an almost enclosed box 671. Moreover, in the interface section 625, a boat liner 676 for mounting a plurality of (three in FIG. 11) wafer boats 674 and one dummy wafer boat 675 is disposed to be movable reciprocating in the Y-direction. The inside the interface section 625 is set at a low-oxygen atmosphere.

The cure processing section 624 is communicated with the interface section 625 via an opening window 677. In the cure processing section 624, the vertical type annealing furnace 678, a boat elevator 679 disposed below the vertical type annealing furnace 678, for raising and lowering the wafer boat 674 to carry it into the vertical type annealing furnace 678, and a transfer mechanism 680 for carrying in/out the wafer boat 674 from/to the boat liner 676 in the interface section 625 to/form the boat elevator 679 are arranged.

Figure 13:
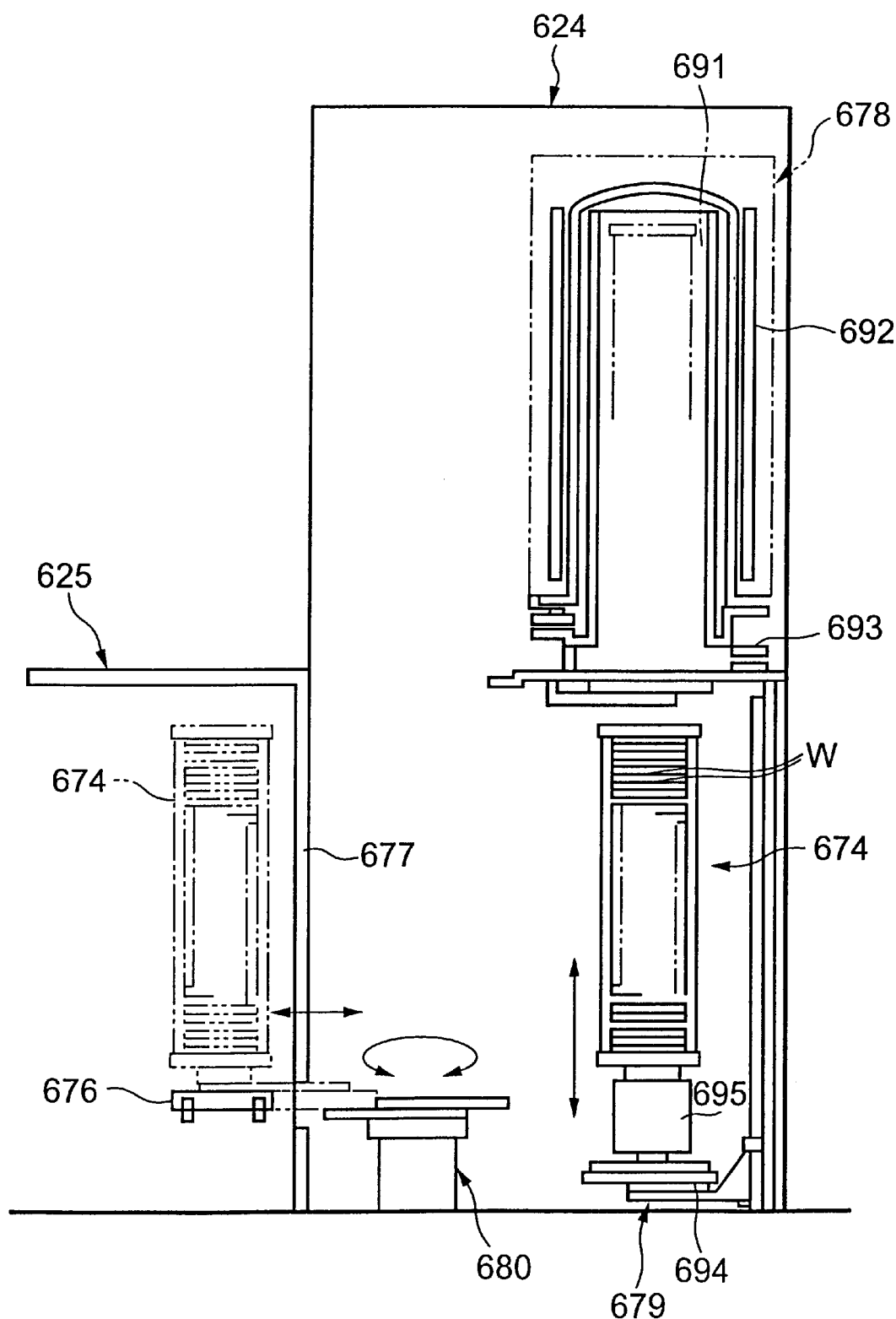
FIG. 13 is a vertical sectional view showing a cure processing section of the film forming system according to the second embodiment.

In the cure processing section 624, as shown in FIG. 13, a process tube 691 made of quartz of inverted-U shape cross-section is housed in the annealing furnace 678 and a heater 692 surrounds the outer periphery of the process tube 691. A manifold 693 is provided connecting with the lower end of the opening of the process tube 691. To the manifold 693, an introducing pipe (not shown) for introducing a predetermined processing gas into the process tube 691 and an exhaust pipe (not shown) for exhausting gas after processing are connected separately. Moreover, the boat elevator 679 is provided with a lid body 694 for maintaining the inside of the process tube 691 in a enclosed state by abutting to the manifold 693 and a pedestal (heat insulating mould) 695 is loaded on top of the lid body 694.

In this embodiment, it is possible to form layer insulating layers and hard mask layers using the film forming system structures as above and to form trench wiring and a plug by the dual damascene method as in the aforesaid first embodiment.

Next, the film forming system of another structure will be explained as a third embodiment. The third embodiment has a structure in which a coating unit for applying a resist film which is formed in the photolithography process is added to the aforesaid insulating film forming system. Hereinafter, an explanation is given with reference to the drawings.

Figure 14:
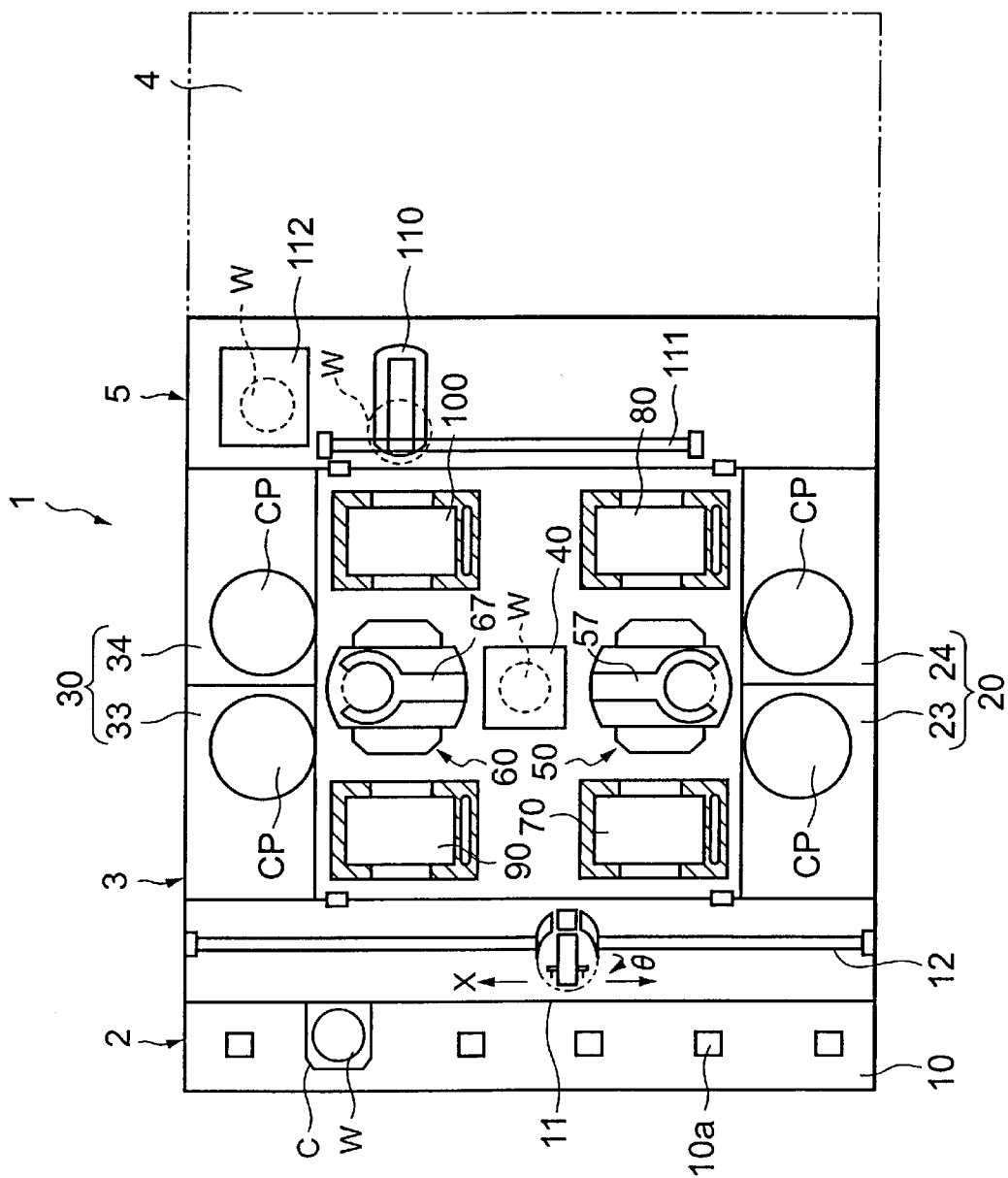
FIG. 14 is a plane view of a film forming system according to a third embodiment.
Figure 15:
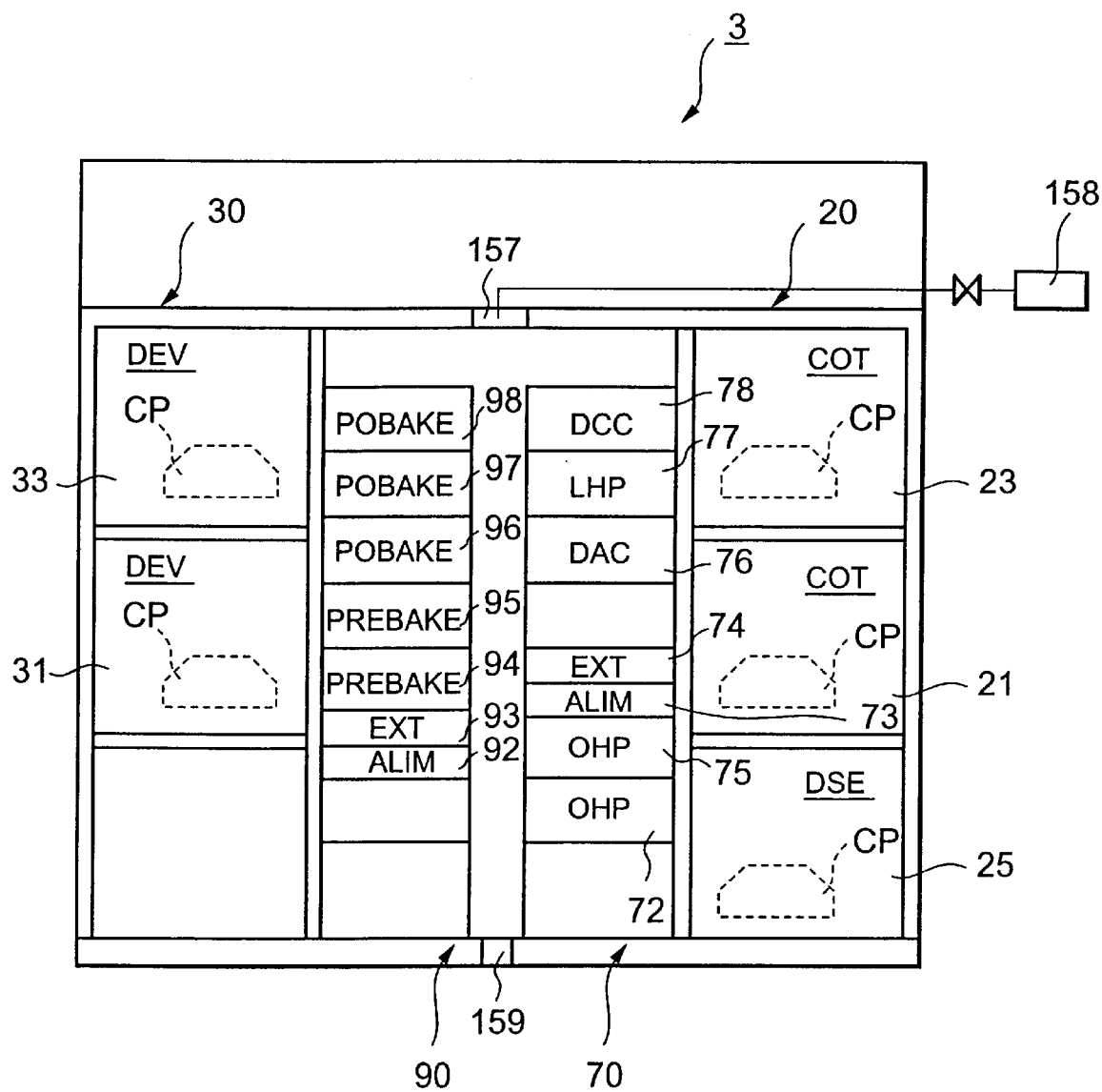
FIG. 15 is a side view of the film forming system shown in FIG. 14.
Figure 16:
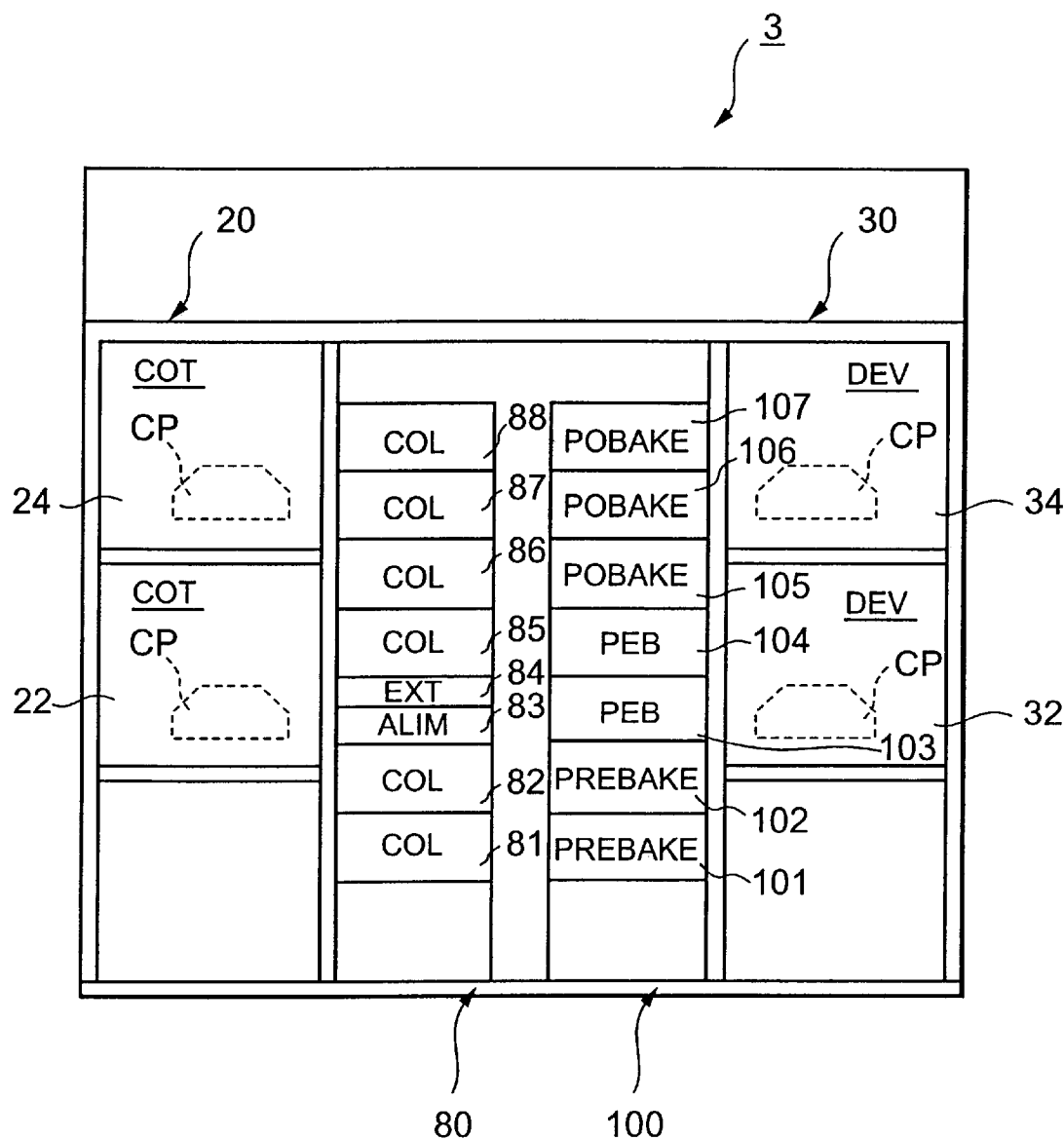
FIG. 16 is another side view of the film forming system shown in FIG. 14.

FIG. 14 to FIG. 16 are views showing the appearance of the film forming system used when an insulating film of the aforesaid semiconductor device is formed. FIG. 14 shows the appearance as seen from a plane and FIG. 15 and FIG. 16 show the appearance as seen from sides respectively.

This film forming system 1 has a structure in which a cassette station 2 for carrying a plurality of, for example, 25 wafers W as a unit from/to the outside into/from the film forming system 1 and carrying the wafer W into/out of a wafer cassette C, a processing station 3 in which various kinds of processing units each for performing predetermined processing for the wafers W one by one in a film-forming process are multi-tiered, and an interface section 5 for delivering the wafer W from/to an aligner 4 disposed adjacent to the processing station 3 are integrally connected.

In the cassette station 2, a plurality of cassettes C are mountable in a line along an X-direction (a vertical direction in FIG. 14), with the respective ports for the wafer the processing station 3 side at positions of positioning projections 10a on a cassette mounting table 10. A wafer transfer body 11 moveable in the direction of arrangement of the cassettes C (the X-direction) and in the direction of arrangement of the wafers W housed in the cassettes C (a Z-direction; a vertical direction), can freely move along a transfer path 12 so as to be selectively accessible to each cassette C.

The wafer transfer body 11 is also structured to be rotatable in a θ-direction so as to be accessible to an extension unit (EXT) 74 included in a multi-tiered unit section of a first processing unit group 70 which will be explained later, for delivering the wafer between the wafer transfer body 11 and a first transfer device 50 which will be explained later, and to an extension unit (EXT) 93 included in a fourth processing unit group 90, for delivering the wafer between the wafer transfer body 11 and a second transfer device 60 which will be explained later.

In the processing station 3, a first coating unit group 20 composed of an insulating film coating unit, a resist coating unit, and an exchange coating unit and a second coating unit group 30 composed of developing processing units are disposed at the front side and the rear side respectively.

The first coating unit group 20 is composed of resist coating units 22 and 24 being tiered, and separately, further an organic insulating film coating unit 23, an inorganic insulating film coating unit 21, and an exchange-chemical coating unit 25 being tiered as shown in FIG. 15 and FIG. 16. In each of the resist coating units 22 and 24, a resist solution is applied by a spin coating while a wafer W is mounted on a spin chuck in a cup CP, whereby resist coating processing is performed for the wafer W. In the organic insulating film coating unit 23, an organic insulating film material, in this case, SILK, is applied by the spin coating while a wafer W is mounted on a spin chuck in a cup CP, whereby organic insulating film coating processing is performed for the wafer W. In the inorganic insulating film coating unit 21, an inorganic insulating film material, in this case, Nanoglass (from Allied signal), is applied by the spin coating while a wafer W is mounted on a spin chuck in a cup CP, whereby inorganic insulating film coating processing is performed for the wafer W. In the exchange-chemical coating unit 25, a chemical for exchange such as HMDS, heptane or the like, is supplied onto the wafer W by the spin coating while a wafer W is mounted on a spin chuck in a cup CP, whereby processing of exchanging the solvent in the inorganic insulating film applied on the wafer W for another solvent prior to a drying process.

The second coating unit group 30 is composed of developing processing units 33 and 31, and developing processing units 34 and 32 being separately tiered as shown in FIG. 15 and FIG. 16. In each of the developing processing units 31 to 34, a developing solution is supplied while a wafer W is mounted on a spin chuck in a cup CP, whereby developing processing is performed for the wafer W.

The processing station 3 is provided with a supply port 157 for supplying gas to bring a space in the processing station to a low-oxygen atmosphere, and gas is supplied by a gas supply source 158. Moreover, a gas exhaust port 159 is provided. Accordingly, nitrogen gas in the gas supply source 158 is supplied into the processing station 3 from the supply port 157 to bring the inside of the processing station 3 to a low-oxygen atmosphere and further the nitrogen gas can be discharged from the exhaust port 159.

The aforesaid resist coating unit, organic insulating film coating unit, inorganic insulating film coating unit, exchange-chemical coating unit, and developing processing unit have the same spinner-type processing unit structure. In other words, in each unit, an annular cup CP is disposed at the center of the bottom of the unit and a spin chuck is disposed inside the cup CP. The spin chuck is structured to rotate by rotational driving force of a drive motor while securely holding a wafer W by vacuum holding. The drive motor is disposed to be movable up and down by means of a cylinder not shown, whereby the spin chuck is ascendable and descendable. Moreover, each unit is provided with a solution supply nozzle for supplying a solution (a resist solution in the resist coating unit, an organic insulating film material in the organic insulating film coating unit, an inorganic insulating film material in the inorganic insulating film coating unit, a chemical for exchange in the exchange-chemical coating unit, and a developing solution in the developing processing unit) onto the wafer front face of the wafer W. The solution supply nozzle is transported from a nozzle waiting section provided outside the cup CP to a predetermined solution discharge position which is set at a position above the spin chuck.

A delivery table 40 which can mount a wafer W thereon is provided at the center of the processing station 3.

The aforesaid first coating unit group 20 and second coating unit group 30 face each other with the delivery table 40 therebetween. The first transfer device 50 is provided between the first coating unit group 20 and the delivery table 40, and the second transfer device 60 is provided between the second coating unit group 30 and the delivery table 40 respectively.

Figure 17:
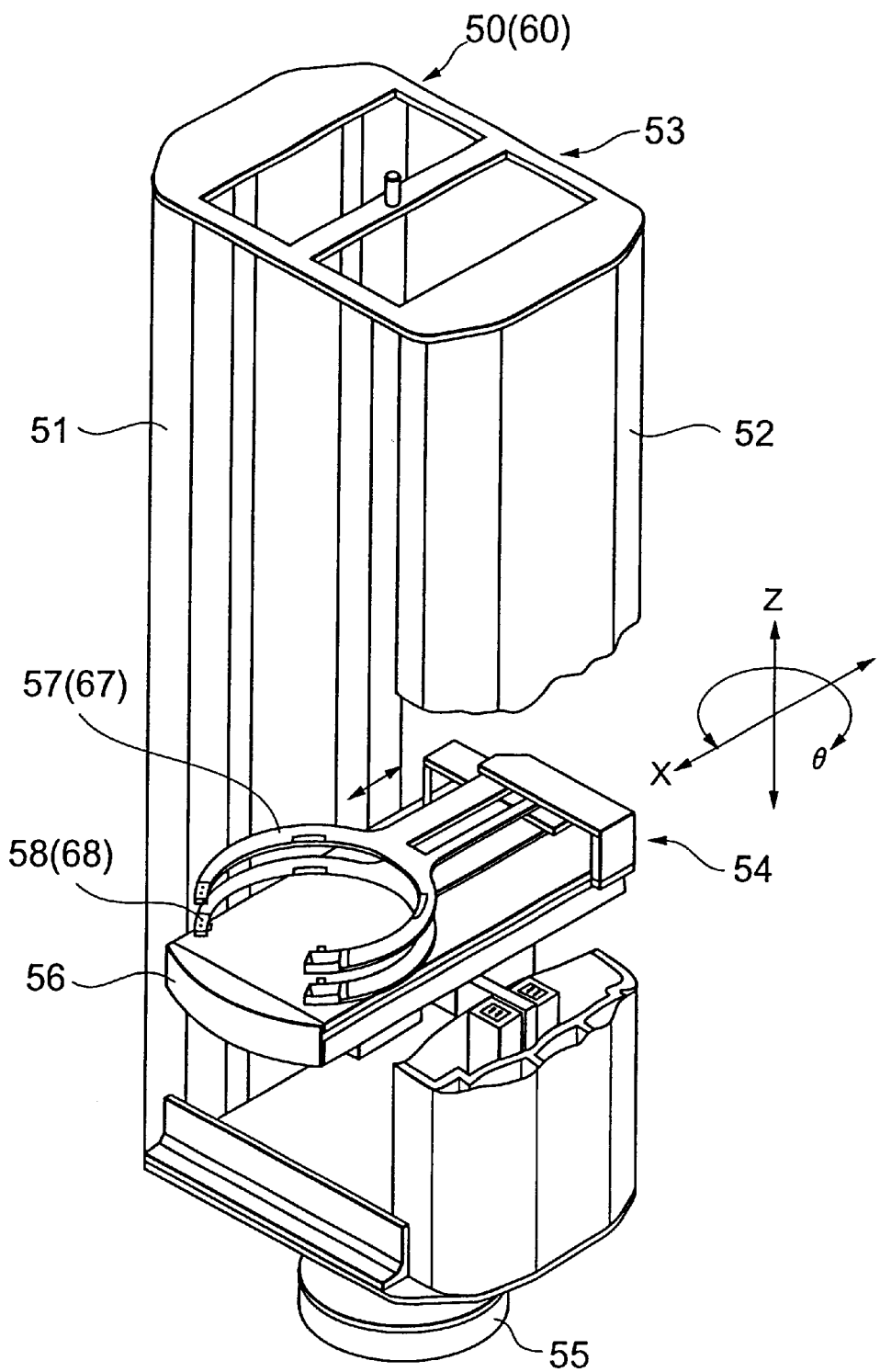
FIG. 17 is a perspective view of a transfer device in the film forming system shown in FIG. 14.

The first transfer device 50 and the second transfer device 60 basically have the same structure. Explaining the structure of the first transfer device 50 with reference to FIG. 17, the first transfer device 50 is provided with a wafer transfer means 54 which is ascendable and descendable in the vertical direction (the Z-direction) inside a cylindrical supporter 53 composed of a pair of wall portions 51 and 52 which are connected with each other at respective upper ends and lower ends and face each other. The cylindrical supporter 53 is connected to a rotation shaft of a motor 55 and rotates integrally with the wafer transfer means 54 around the aforesaid rotation shaft by rotational driving force of the motor 55. Accordingly, the wafer transfer means 54 is rotatable in the θ-direction.

Two tweezers 57 and 58, for example, are vertically provided on a transfer base 56 of the wafer transfer means 54. The tweezers 57 and 58 each basically have the same structure and have a shape and a size capable of freely passing through a side opening between both the wall portions 51 and 52 of the cylindrical supporter 53. Each of the tweezers 57 and 58 is movable back and forth by a motor (not shown) embedded in the transfer base 56. It should be noted that the second transfer device 60 is provided with tweezers 67 and 68 having the same function and the same structure as the tweezers 57 and 58.

On both sides of the first transfer device 50, the first processing unit group 70 in which various kinds of units are multi-tiered and a second processing unit group 80 in which cooling-system processing units are arranged respectively near the first coating unit group 20. On both sides of the second transfer device 60, the fourth processing unit group 90 and a third processing unit group 100 in each of which various kinds of thermal-system processing units are multi-tiered are arranged respectively near the second coating unit group 30.

The first processing unit group 70 and the fourth processing unit group 90 are arranged on the cassette station 2 side and the second processing unit group 80 and the third processing unit group 100 are arranged on the interface section 5 side.

Now, the structures of the first processing unit group 70 and the fourth processing unit group 90 are explained with reference to FIG. 15 in which the processing station 3 is seen from the cassette station 2 side.

In the first processing unit group 70, low-oxygen and high-temperature heat processing units (OHP) 72 and 75, an alignment unit (ALIM) 73 for performing alignment of the wafer W, an extension unit (EXT) 74 for allowing the wafer W to wait therein, an aging processing unit (DAC) 76, a low-temperature heat processing unit (LHP) 77, and a low-oxygen curing and cooling processing unit (DCC) 78 are tiered from the bottom in order. In the aging processing unit (DAC), a processing gas (NH$_3$+H$_2$O) in which ammonia gas and water vapor are mixed is introduced into a sealable processing chamber to perform aging processing for the wafer W, thereby wet gelling an insulating film material film on the wafer W.

In the fourth processing unit group 90, an alignment unit (ALIM) 92, an extension unit (EXT) 93, prebaking units (PREBAKE) 94 and 95 for performing heat processing for the wafer W which has been coated with a resist, and postbaking units (POBAKE) 96, 97, and 98 for performing heat processing for the wafer W after developing processing are tiered from the bottom in order.

Next, the structures of the second processing unit group 80 and the third processing unit group 100 are explained with reference to FIG. 16 in which the processing station 3 is seen from the interface section 5 side.

In the second processing unit group 80, cooling units (COL) 81 and 82, an alignment unit (ALIM) 83, an extension unit (EXT) 84, and cooling units (COL) 85, 86, 87, and 88 are tiered from the bottom in order.

In the third processing unit group 100, prebaking units (PREBAKE) 101 and 102, post-exposure baking units (PEB) 103 and 104 for performing heat processing for the wafer W after exposure processing, and postbaking units (POBAKE) 105, 106, and 107 are tiered from the bottom in order.

The interface section 5 is provided with a wafer transfer body 110 which is accessible to the extension unit (EXT) 84 included in the second processing unit group 80 and each of the post-exposure baking units (PEB) 103 and 104 included in the third processing unit group 100.

The wafer transfer body 110 can freely move in the X-direction along rails 111 and move up and down in the Z-direction (the vertical direction in FIG. 14) and is also rotatable in the θ-direction. The wafer transfer body 110 is so structured as to transfer the wafer W to the aligner 4 and an edge aligner 112.

Figure 21:
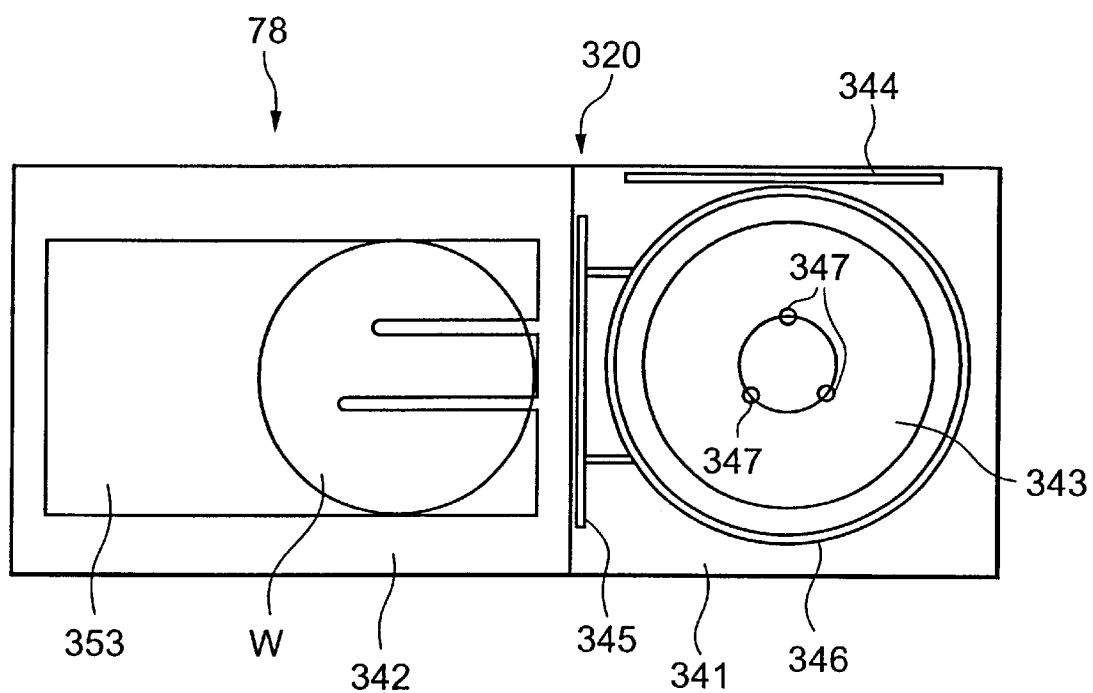
FIG. 21 is a plane view of a low-oxygen curing and cooling processing unit (DCC) of the film forming system shown in FIG. 14.
Figure 22:
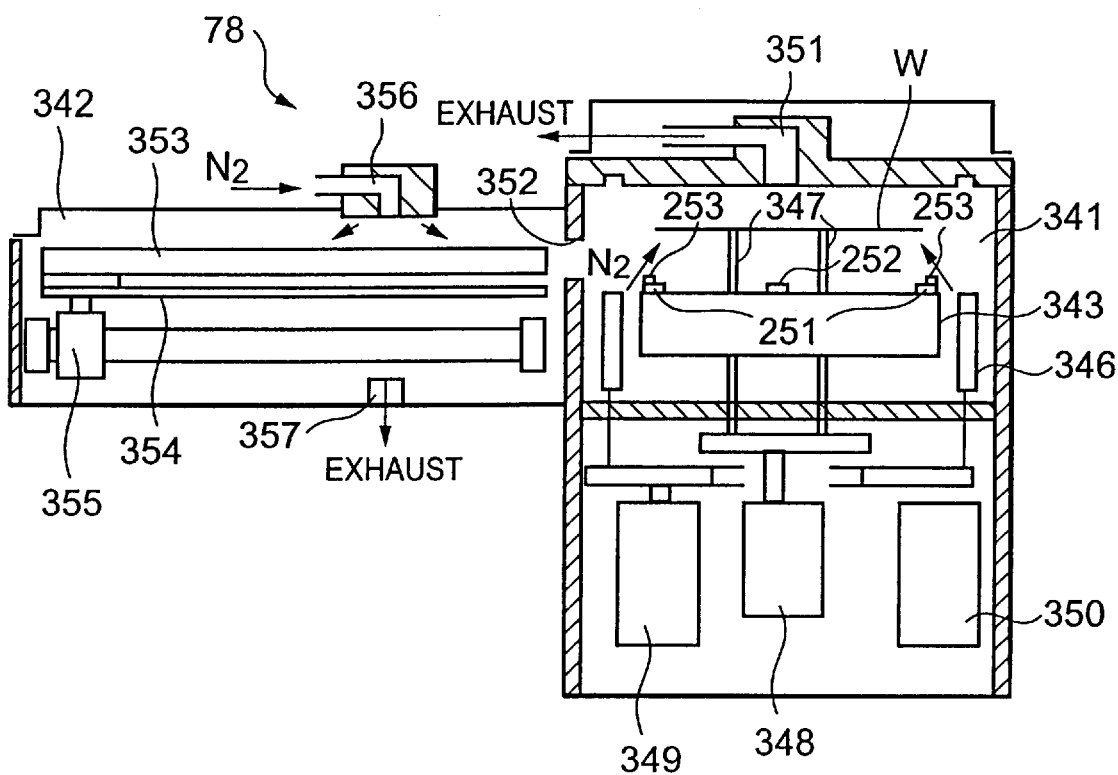
FIG. 22 is a sectional view of FIG. 21.

FIG. 21 is a plane view of the aforesaid low-oxygen curing and cooling processing unit (DCC) and FIG. 22 is a sectional view thereof.

The low-oxygen curing and cooling processing unit (DCC) includes a heat processing chamber 341 and a cooling processing chamber 342 provided adjacent thereto. The heat processing chamber 341 includes a hot plate 343 of which the set temperature can be 200° C. to 470° C. The low-oxygen curing and cooling processing unit (DCC) further includes a first gate shutter 344 which is opened and closed when the wafer W is delivered to/from the first transfer device 50, a second gate shutter 345 for opening and closing a space between the heat processing chamber 341 and the cooling processing chamber 342, and a ring shutter 346 which is raised and lowered integrally with the second gate shutter 345 while surrounding the wafer W around the hot plate 343. Further, three support pins 347 for mounting the wafer W thereon and raising and lowering the wafer W are ascendably and descendably provided within the hot plate 343. A shield screen may be provided between the hot plate 343 and the ring shutter 346.

A raising and lowering mechanism 348 for raising and lowering the aforesaid three support pins 347, a raising and lowering mechanism 349 for raising and lowering the ring shutter 346 together with the second gate shutter 345, and a raising and lowering mechanism 350 for raising and lowering the first gate shutter 344 to open and close are provided under the heat processing chamber 341.

The heat processing chamber 341 is so structured that an inert gas such as N$_2$ or the like is supplied thereinto from a supply source not shown and air therein is exhausted via an exhaust pipe 351. Air is exhausted while the inert gas is being supplied, whereby the inside of the heat processing chamber 341 is maintained in a low-oxygen concentration (for example, 50 ppm or less) atmosphere.

The heat processing chamber 341 and the cooling processing chamber 342 are communicated a with each other via a communicating port 352. A cooling plagued 353 for mounting and cooling the wafer W is so structured as to be movable in the horizontal direction by means of a moving mechanism 355 along a guide plagued 354. Thereby, the cooling plate 353 can enter the heat processing chamber 341 through the communicating port 352 so as to receive the wafer W which has been heated by the hot plate 343 in the heat processing chamber 341 from the support pins 347, carry the wafer W into the cooling chamber 342, and return of the wafer W to the support pins 347 after the wafer W is cooled.

Further, the cooling processing chamber 342 is so structured that an inert gas such as N$_2$ or the like is supplied thereinto via a supply pipe 356 and air therein is exhausted to the outside via an exhaust pipe 357. Thereby, the inside of the cooling processing chamber 342 is maintained in a low-oxygen concentration (for example, 50 ppm or less) atmosphere as in the heat processing chamber 341.

The low-oxygen and high-temperature heat processing units (OHP) 72 and 75 have the same structure as the low-oxygen and high-temperature heat processing unit (OHP) 449 in the first embodiment. The low-temperature heat processing unit (LHP) 77 has the same structure as the low-oxygen and high-temperature heat processing unit (OHP) but only the set temperature for the wafer W is different.

Next, the procedure of fabricating a semiconductor device having the structure shown in FIG. 19(e) which is fabricated through the dual damascene process using the film forming system 1 structured as above will be explained with reference to FIG. 18 to FIG. 20. FIG. 18 and FIG. 19 are views for explaining the fabrication process of the semiconductor device fabricated through the dual damascene process. FIG. 20 shows a processing flow in the semiconductor device fabrication including the processing flow in the aforesaid film forming system.

First, the structure of the semiconductor device to be fabricated is explained.

Figure 19A:
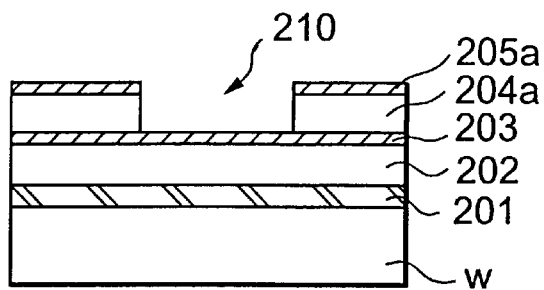
FIG. 19 is a view (second) showing the fabricating processes of a semiconductor device according to the third embodiment.
Figure 19B:
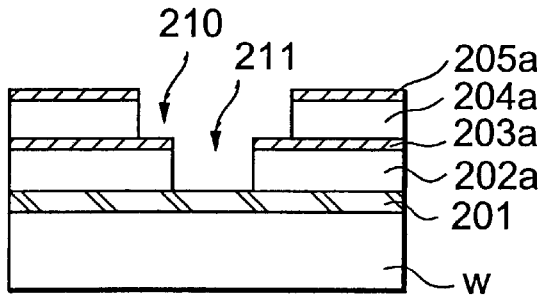
Figure 19C:
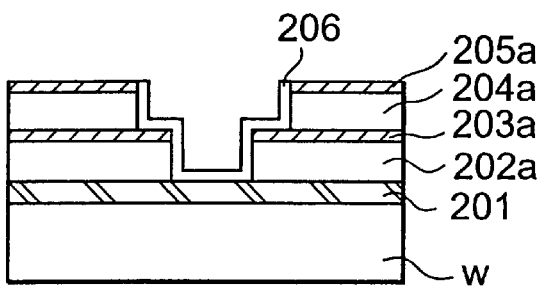
Figure 19D:
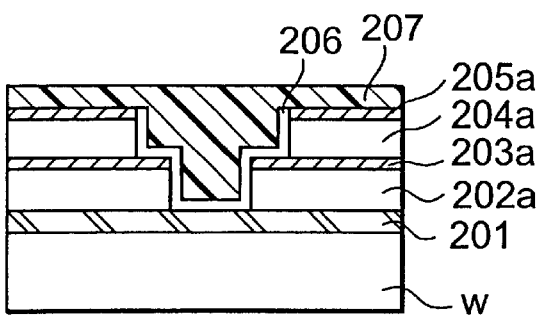
Figure 19E:
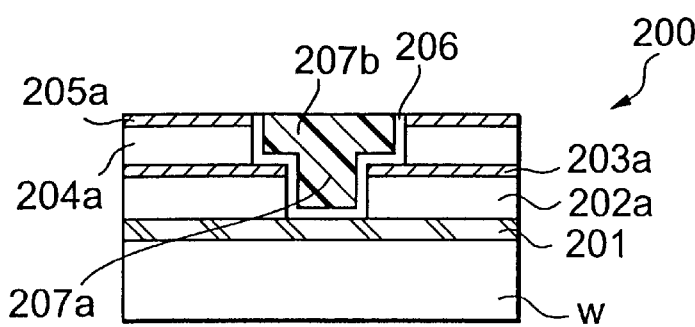
Figure 20:
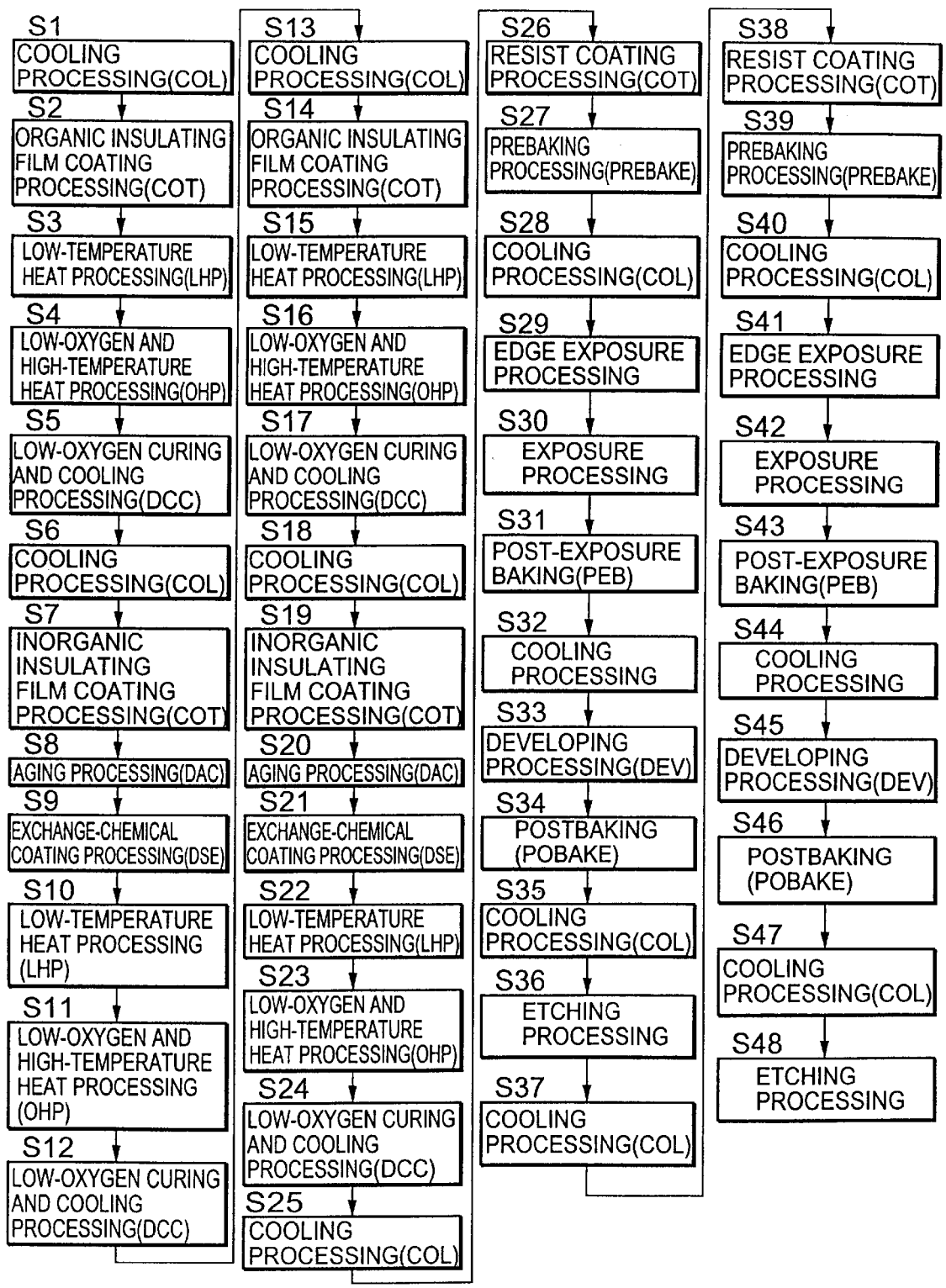
FIG. 20 is a chart showing a processing flow in the semiconductor device fabrication according to the third embodiment.

As shown in FIG. 19(e), in a semiconductor device 200, a lower level wiring 201 is disposed on the semiconductor wafer W (hereinafter, the wafer W) and a layer insulating film composed of an organic insulating film 202a, an inorganic insulating film 203a, an organic insulating film 204a, and an inorganic insulating film 205a is formed on the lower level wiring 201. In the layer insulating film, a wiring 207b made of, for example, copper as a conductive material and a connecting plug 207a made of copper for connecting the lower level wiring 201 and the wiring 207b are formed. Further, titanium nitride, for example, for protecting the side walls is formed between the layer insulating film, and the wiring 207b and the connecting plug 207a to prevent copper from diffusing into the layer insulating film.

For the organic insulating films 202a and 204a, organic insulating film having a low dielectric constant characteristic with a dielectric constant of three or less can be used. For example, organic polymers such as PAE-2 (from Shumacher), HSG-R7 (from Hitachi Chemical), FLARE (from Allied Signal), BCB (from Dow Chemical), SILK (from Dow Chemical), and Speed Film (from W. L. Gore)

can be used. In the present invention, SILK (from Dow Chemical) is used. Further, in the present invention, silicon nitride film is used for the inorganic insulating film 203a and silicon oxide film is used for the inorganic insulating film 205a, but materials are not limited to these and inorganic SOG film, for example, may be used. A material having enough strength for the CMP processing in the dual damascene process is suitable as the inorganic insulating film 205a. Insulating films are used for the layer insulating film as described above, thereby realizing a low dielectric constant characteristic of the layer insulating film and decreasing a capacitance produced between the lower level wiring 201 and the wiring 207b. Moreover, inorganic insulating films are used for the layer insulating film, thereby enhancing mechanical strength and heat resistance.

Next, a fabricating method of the semiconductor device using the aforesaid film forming system will be explained.

Figure 18A:
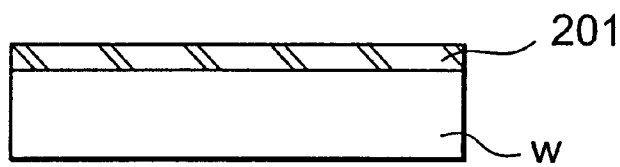
FIG. 18 is a view (first) showing fabricating processes of a semiconductor device according to the third embodiment.

First, as shown in FIG. 18(a), the wafer W on which the lower level wiring 201 is formed is prepared and the wafer W is housed in the cassette C mounted on the cassette mounting table 10. On the cassette mounting table 10, the wafer W before processing is transferred from the wafer cassette C into the extension unit (EXT) 74 of the first processing unit group 70 on the processing station 3 side by the medium of the wafer transfer body 11. Nitrogen gas in the gas supply source 158 is supplied from the supply port 157 into the processing station 3, thereby bringing the processing station 3 to a low-oxygen atmosphere. Therefore, the transfer of the wafer W between various kinds of units which will be described later is performed under a low-oxygen atmosphere. Consequently, oxidation of the coating film applied on the wafer W by involuntary reaction with oxygen can be prevented.

The wafer W transferred to a delivery table in the extension unit (EXT) 74 is transferred into the cooling unit (COL) 81, for example, of the second processing unit group 80 by the medium of the first transfer device 50. Then, the wafer W is cooled to approximately 23° C. in the cooling unit (COL) (Si).

Figure 18B:
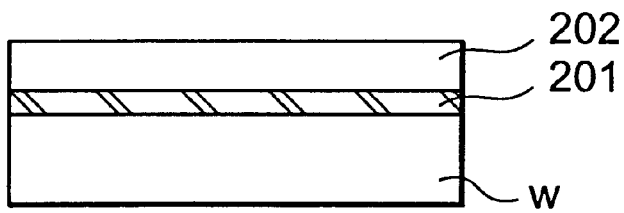

The wafer W which has undergone the cooling processing in the cooling unit (COL) is transferred to the organic insulating film coating unit (COT) 23 of the first coating unit group 20 by the medium of the first transfer device 50. Then, in the organic insulating film coating unit (COT) 23, an organic insulating film material with a thickness of, for example, about 200 nm to about 500 nm, more preferably, approximately 300 nm is applied onto the wafer w by a spin coating (S2). Thereby, as shown in FIG. 18(b), an organic insulating film 202 is formed covering the lower level wiring 201 on the wafer W. Here, SILK is used as the organic insulating film material.

The wafer W coated with the organic insulating film material in the organic insulating film coating unit (COT) 23 is transferred to the low-temperature heat processing unit (LHP) 77 of the first processing unit group 70 by the medium of the first transfer device 50. The wafer W is subjected to low-temperature heat processing, for example, for about 60 seconds at approximately 150° C. in a low-oxygen atmosphere in the low-temperature heat processing unit (LHP) 77.W facing The wafer W which has undergone the low-temperature heat processing in the low-temperature heat processing unit (LHP) 77 is transferred to the low-oxygen and high-temperature heat processing unit (OHP) 75 of the first processing unit group 70 by the medium of the first transfer device 50. Then, the wafer W is subjected to high-temperature heat processing, for example, for about 60 seconds at approximately 200° C. in a low-oxygen atmosphere in the low-oxygen and high-temperature heat processing unit (OHP) 75. Further, the wafer W which has undergone the high-temperature heat processing in the low-oxygen and high-temperature heat processing unit (OHP) 75 is transferred to another low-oxygen and high-temperature heat processing unit (OHP) 72 which is set at a higher temperature by the medium of the first transfer device 50. Then, the wafer W is subjected to high-temperature heat processing for about 60 seconds at approximately 350° C. in a low-oxygen atmosphere, for example, in an oxygen atmosphere of 100 ppm in the low-oxygen and high-temperature heat processing unit (OHP) 72 (S4).

The wafer W which has undergone the high-temperature heat processing in the low-oxygen and high-temperature heat processing unit (OHP) 72 is transferred to the low-oxygen curing and cooling processing unit (DCC) 78 of the first processing unit group 70 by the medium of the first transfer device 50. Then, the wafer W is subjected to high-temperature heat processing for about 60 seconds at approximately 450° C. and thereafter cooling processing at approximately 23° C. in a low-oxygen atmosphere in the low-oxygen curing and cooling processing unit (DCC) 78 (S5).

The wafer W which has been processed in the low-oxygen curing and cooling processing unit (DCC) 78 is transferred to the cooling unit (COL) 82, for example, of the second processing unit group by the medium of the first transfer device 50. Then, the wafer W is cooled to about 23° C. in the cooling unit (COL) 82 (S6).

Figure 18C:
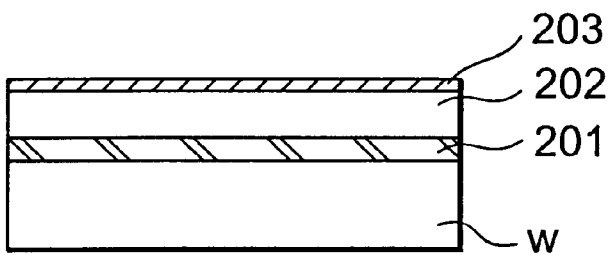

The wafer W which has undergone the cooling processing in the cooling unit (COL) 82 is transferred to the inorganic insulating film coating unit (COT) 21 of the first coating unit group 20 by the medium of the first transfer device 50. Then, in the inorganic insulating film coating unit (COT) 21, an inorganic insulating film material with a thickness of about 300 nm to about 1100 nm, more preferably, approximately 700 nm, for example, is applied onto the wafer W (S7). Thereby, as shown in FIG. 18(c), an inorganic insulating film 203 is formed on the organic insulating film 202. Here, Nanoglass is used as the inorganic insulating film material.

The wafer W which has been coated with the inorganic insulating film material in the inorganic insulating film coating unit (COT) 21 is transferred to the aging processing unit (DAC) 76 of the first processing unit group by the medium of the first transfer device 50. Then, in the aging processing unit (DAC) 76, ($NH_3+H_2O$) gas is introduced into the processing chamber to perform aging processing for the wafer W, thereby gelling the inorganic insulating film material on the wafer W (S8).

The wafer W which has undergone the aging processing in the aging processing unit (DAC) 76 is transferred to the exchange-chemical coating unit (DSE) 25 of the first coating unit group 20 by the medium of the first transfer device 50. Then, in the exchange-chemical coating unit (DSE) 25, a chemical for exchange is supplied onto the wafer W, whereby processing of exchanging a solvent in the insulating film applied on the wafer for another solvent is performed (S9).

The wafer W which has undergone the exchange processing in the exchange-chemical coating unit (DSE) 25 is transferred to the low-temperature heat processing unit (LHP) 77 of the first processing unit group by the medium of the first transfer device 50. Then, in the low-oxygen atmosphere in the low-temperature heat processing unit (LHP) 77, the wafer W is subjected to low-temperature heat processing for about 60 seconds at approximately 175° C., for example (S10).

The wafer W which has undergone the low-temperature heat processing in the low-temperature heat processing unit (LHP) 77 is transferred to the low-oxygen and high-temperature heat processing unit (OHP) 75 by the medium of the first transfer device 50. Then, in the low-oxygen atmosphere in the low-oxygen and high-temperature heat processing unit (OHP) 75, the wafer W is subjected to high-temperature heat processing for about 60 seconds at approximately 310° C., for example (S11). Through the heat processing in the low-temperature heat processing unit (LHP) 77 and the low-oxygen and high-temperature heat processing unit (OHP) 75, vaporization of the solvent is performed.

The wafer W which has undergone the high-temperature heat processing in the low-oxygen and high-temperature heat processing unit (OHP) 75 is transferred to the low-oxygen curing and cooling processing unit (DCC) 78 by the medium of the first transfer device 50. Then, in the low-oxygen atmosphere in the low-oxygen curing and cooling processing unit (DCC) 78, the wafer W is subjected to high-temperature heat processing for about 60 seconds at approximately 450° C., for example, and thereafter to cooling processing at approximately 23° C. (S12).

The wafer W which has been processed in the low-oxygen curing and cooling processing unit (DCC) 78 is transferred to the cooling unit (COL) 85, for example, of the second processing unit group 80 by the medium of the first transfer device 50. Then, the wafer W is cooled to about 23° C., for example, in the cooling unit (COL) 85 (S13).

Figure 18D:
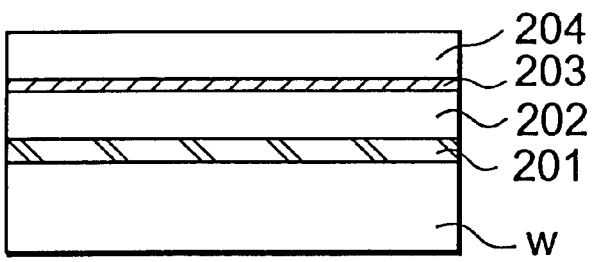

The wafer W which has undergone the cooling processing in the cooling unit (COL) 85 is transferred to the organic insulating film coating unit (COT) 23 of the first coating unit group 20 by the medium of the first transfer device 50. Then, in the organic insulating film coating unit (COT) 23, an organic insulating film material with a thickness of about 200 nm to about 500 nm, more preferably, approximately 300 nm is applied on the wafer W by a spin coating (S14). Thereby, as shown in FIG. 18(d), an organic insulating film 204 is formed on the inorganic insulating film 203. Here, SILK is used as the organic insulating film material.

The wafer W which has been coated with the organic insulating film material in the organic insulating film coating unit (COT) 23 is transferred to the low-temperature heat processing unit (LHP) 77 of the first processing unit group 70 by the medium of the first transfer device 50. Then, the wafer W is subjected to low-temperature heat processing for about 60 seconds at approximately 150° C., for example, in the low-oxygen atmosphere in the low-temperature heat processing unit (LHP) 77 (S15).

The wafer W which has undergone the low-temperature heat processing in the low-temperature heat processing unit (LHP) 77 is transferred to the low-oxygen and high-temperature heat processing unit (OHP) 75 of the first processing unit group 70 by the medium of the first transfer device 50. Then, the wafer W is subjected to high-temperature heat processing, for example, for about 60 seconds at approximately 200° C. in the low-oxygen atmosphere in the low-oxygen and high-temperature heat processing unit (OHP) 75. Further, the wafer W which has undergone the high-temperature heat processing in the low-oxygen and high-temperature heat processing unit (OHP) 75 is transferred to another low-oxygen and high-temperature heat processing unit (OHP) 72 which is set at a higher temperature by the medium of the first transfer device 50. Then, the wafer W is subjected to high-temperature heat processing, for example, for about 60 seconds at approximately 350° C. in the low-oxygen atmosphere in the low-oxygen and high-temperature heat processing unit (OHP) 72 (S16).

The wafer W which has undergone the high-temperature heat processing in the low-oxygen and high-temperature heat processing unit (OHP) 72 is transferred to the low-oxygen curing and cooling processing unit (DCC) 78 of the first processing unit group 70 by the medium of the first transfer device 50. Then, the wafer W is subjected to high-temperature heat processing for about 60 seconds at approximately 450° C. and thereafter cooling processing at approximately 23° C. in the low-oxygen atmosphere in the low-oxygen curing and cooling processing unit (DCC) 78 (S17).

The wafer W which has been processed in the low-oxygen curing and cooling processing unit (DCC) is transferred to the cooling unit (COL) 82, for example, of the second processing unit group by the medium of the first transfer device 50. Then, the wafer W is cooled to about 23° C. in the cooling unit (COL) 82 (S18).

Figure 18E:
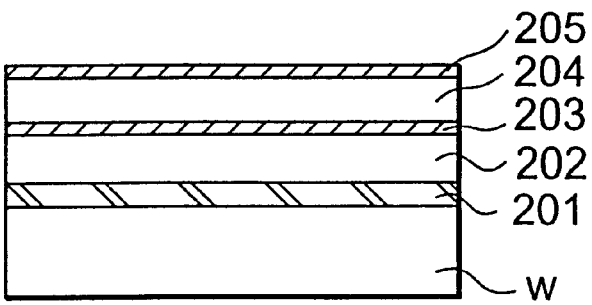

The wafer W which has undergone the cooling processing in the cooling unit (COL) is transferred to the inorganic insulating film coating unit (COT) 21 of the first coating unit group 20 by the medium of the first transfer device 50. Then, in the inorganic insulating film coating unit (COT) 21, for example, an inorganic insulating film material with a thickness of about 300 nm to about 1100 nm, more preferably, approximately 700 nm is applied on the wafer W (S19). Thereby, as shown in FIG. 18(e), an inorganic insulating film 205 is formed on the organic insulating film 204, whereby a layer insulating film in which organic insulating films and inorganic insulating films are laminated is formed on the lower level wiring 201 on the wafer W. Here, Nanoglass is used as the inorganic insulating film material.

The wafer W which has been coated with the inorganic insulating film material in the inorganic insulating film coating unit (COT) 21 is transferred to the aging processing unit (DAC) 76 of the first processing unit group by the medium of the first transfer device 50. Then, in the aging processing unit (DAC) 76, ($NH_3+H_2O$) gas is introduced into the processing chamber to perform aging processing for the wafer W, thereby gelling the inorganic insulating film material (S20).

The wafer W which has undergone the aging processing in the aging processing unit (DAC) 76 is transferred to the exchange-chemical coating unit (DSE) 25 of the first coating unit group 20 by the medium of the first transfer device 50. Then, in the exchange-chemical coating unit (DSE) 25, a chemical for exchange is supplied onto the wafer W, whereby processing of exchanging a solvent in the insulating film applied on the wafer for another solvent is performed (S21).

The wafer W which has undergone the exchange processing in the exchange-chemical coating unit (DSE) 25 is transferred to the low-temperature heat processing unit (LHP) 77 of the first processing unit group by the medium of the first transfer device 50. Then, in the low-oxygen atmosphere in the low-temperature heat processing unit (LHP) 77, the wafer W is subjected to low-temperature heat processing, for example, for about 60 seconds at approximately 175° C. (S22).

The wafer W which has undergone the low-temperature heat processing in the low-temperature heat processing unit (LHP) 77 is transferred to the low-oxygen and high-temperature heat processing unit (OHP) 75 by the medium of the first transfer device 50. Then, in the low-oxygen atmosphere in the low-oxygen and high-temperature heat processing unit (OHP) 75, the wafer W is subjected to high-temperature heat processing, for example, for about 60 seconds at approximately 310° C. (S23).

The wafer W which has undergone the high-temperature heat processing in the low-oxygen and high-temperature heat processing unit (OHP) 75 is transferred to the low-oxygen curing and cooling processing unit (DCC) 78 by the medium of the first transfer device 50. Then, in the low-oxygen atmosphere in the low-oxygen curing and cooling processing unit (DCC) 78, the wafer W is subjected to high-temperature heat processing, for example, for about 60 seconds at approximately 450° C. and thereafter to cooling processing at approximately 23° C. (S24).

The wafer w which has been processed in the low-oxygen curing and cooling processing unit (DCC) 78 is transferred to the cooling unit (COL) 85, for example, of the second processing unit group 80 by the medium of the first transfer device 50. Then, the wafer W is cooled to about 23° C., for example, in the cooling unit (COL) 85 (S25).

The wafer W which has undergone the cooling processing in the cooling unit (COL) 85 is transferred to the resist coating unit (COT) 22 of the first coating unit group 20 by the medium of the first transfer device 50. Then, in the resist coating unit (COT) 22, a resist film is formed (S 26). As the resist film, an acetal resist, for example, can be used.

The wafer W on which the resist film has been formed is then transferred to the delivery table 40 while being held by the tweezers 57 on the upper side of the first transfer device 50.

The wafer W transferred to the delivery table 40 is held by the tweezers 68 of the second transfer device 60, carried to the prebaking processing unit (PREBAKE) 101, for example, of the third processing unit group 100 this time, and subjected to predetermined heat processing (S27).

The wafer W after the completion of the above heat processing is transferred to the cooling unit (COL) 86 of the second processing unit group 80 while being held by the tweezers 68 of the second transfer device and subjected to cooling processing (S28). The wafer W for which the cooling processing has been finished in the cooling unit (COL) 86 is carried into the extension unit (EXT) 84 of the second processing unit group 80 and waits there.

Subsequently, the wafer W is carried out of the extension unit (EXT) 84 by the wafer transfer body 110 and transferred to the edge aligner 112. Then, unnecessary resist film at the edge portion is removed in the edge aligner 112 (S29). Thereafter the wafer W is transferred to the aligner 4 and subjected to predetermined exposure processing (S30).

The wafer w which has been exposed in a pattern in the aligner 4 is transferred to the second heat processing unit group 100 by the wafer transfer body 110 and carried into the post-exposure baking unit (PEB) 103, for example, and subjected to heat processing (S31).

Next, the wafer W is held by the tweezers 68 of the second transfer device 60, carried into the cooling unit (COL) 87, for example, of the second processing unit group 80, and subjected to cooling processing (S32).

The wafer W for which the predetermined cooling processing has been finished in the cooling unit (COL) 87 is held by the tweezers 58 of the first transfer device 50 and transferred to the delivery table 40. Thereafter, the wafer W is carried from the delivery table 40 to the developing processing unit (DEV) 31, for example, of the second coating unit group while being held by the tweezers 68 and subjected to predetermined developing processing (S33). Thereby, a resist pattern in a predetermined shape is formed. Here, TMAH (tetramethylammonium hydroxide) is used as the developing solution.

The wafer W for which the developing processing has been finished is carried into the postbaking unit (POBAKE) 105, for example, of the third processing unit group 100 while being held by the tweezers 67 of the second transfer device 60 and subjected to heat processing after the developing processing (S34).

The wafer W for which the heat processing in the postbaking unit (POBAKE) 105 has been finished is transferred to the delivery table 40 while being held by the tweezers 67 of the second transfer device 60.

The wafer W transferred to the delivery table 40 is then held by the tweezers 58 of the first transfer device 50 and transferred to the cooling unit (COL) 88, for example, of the second processing unit group 80. In the cooling unit (COL) 88, the wafer W is subjected to cooling processing vigorously to a predetermined temperature (S35).

Thereafter, the wafer W which has undergone the cooling processing in the cooling unit (COL) 88 is carried into the extension unit 74, for example, of the first processing unit group 70 by the medium of the first transfer device 50 and waits there. Then, the wafer W is carried out of the extension unit 74 by the wafer transfer body 11 and housed in the cassette C on the cassette mounting table 10.

Thereafter, the organic insulating film 204 and the inorganic insulating film 205 are etched, as shown in FIG. 19(a) by dry etching processing with the resist pattern as a mask by means of an etching apparatus not shown for the wafer W. Thereby, the organic insulating film pattern 204a and the inorganic insulating film pattern 205a in which a concave portion 210 corresponding to the wiring is formed can be formed. Here, the etching processing is performed using $CF_4$ gas, for example (S36). After the etching processing, the resist pattern is stripped off.

The wafer W which has undergone the etching processing and the stripping-off of the resist pattern is housed again in the cassette C on the cassette mounting table 10. The housed wafer W is transferred into the extension unit (EXT) 74 of the first processing unit group 70 by the medium of the wafer transfer body 11.

The wafer W transferred to the delivery table in the extension unit (EXT) 74 is transferred into the cooling unit (COL) 85 of the second processing unit group 80 by the medium of the first transfer device 50. Then, in the cooling unit (COL), the wafer W is cooled to about 23° C., for example (S37).

The wafer W which has undergone the cooling processing in the cooling unit (COL) 85 is transferred to the resist coating unit (COT) 24 of the first coating unit group 20 by the medium of the first transfer device 50. Then, in the resist coating unit (COT) 24, a resist film is formed (S38). As the resist film, an acetal resist, for example, can be used.

The wafer w on which the resist film has been formed is transferred to the delivery table 40 while being held by the tweezers 57 on the upper side of the first transfer device 50.

The wafer W transferred to the delivery table 40 is held by the tweezers 68 of the second transfer device 60, carried into the prebaking processing unit (PREBAKE) 102, for example, of the third processing unit group 100 this time, and subjected to predetermined heat processing (S39).

The wafer W after the completion of the above heat processing is transferred to the cooling unit (COL) 86 of the second processing unit group 80 while being held by the tweezers 68 of the second transfer device and subjected to cooling processing (S40). The wafer W for which the cooling processing has been finished in the cooling unit (COL) 86 is carried into the extension unit (EXT) 84 of the second processing unit group 80 and waits there.

Subsequently, the wafer W is carried out of the extension unit (EXT) 84 by the wafer transfer body 110 and transferred to the edge aligner 112. Then, unnecessary resist film at the edge portion is removed in the edge aligner 112 (S41). Thereafter the wafer W is transferred to the aligner 4 and subjected to predetermined exposure processing (S42).

The wafer W which has been exposed in the pattern is transferred to the second heat processing unit group 100 by the wafer transfer body 110 and carried into the post-exposure baking unit (PEB) 104, for example, and subjected to heat processing (S43).

Next, the wafer W is held by the tweezers 68 of the second transfer device 60 and carried into the cooling unit (COL) 87, for example, of the second processing unit group 80 and subjected to cooling processing (S44).

The wafer W for which the predetermined cooling processing has been finished in the cooling unit (COL) 87 is held by the tweezers 58 of the first transfer device 50 and transferred to the delivery table 40. Thereafter, the wafer W is carried from the delivery table 40 into the developing processing unit (DEV) 33, for example, of the second coating unit group while being held by the tweezers 68 and subjected to predetermined developing processing (S45). Thereby, a resist pattern in a predetermined shape is formed. Here, TMAH is used as the developing solution.

The wafer W for which the developing processing has been finished is carried into the postbaking unit (POBAKE) 106, for example, of the third processing unit group 100 while being held by the tweezers 67 of the second transfer device 60 and subjected to heat processing after the developing processing (S46).

The wafer W for which the heat processing in the post-baking unit (POBAKE) 106 has been finished is transferred to the delivery table 40 while being held by the tweezers 67 of the second transfer device 60.

The wafer W transferred to the delivery table 40 is then held by the tweezers 58 of the first transfer device 50 and transferred to the cooling unit (COL) 88 of the second processing unit group 80. In the cooling unit (COL) 88, the wafer W is subjected to cooling processing vigorously to a predetermined temperature (S47).

Thereafter, the wafer W which has undergone the cooling processing in the cooling unit (COL) 88 is carried into the extension unit 74 of the first processing unit group 70 by the medium of the first transfer device 50 and waits there. Then, the wafer W is carried out of the extension unit 74 by the wafer transfer body 11 and housed in the cassette C on the cassette mounting table 10.

Thereafter, the organic insulating film 202 and the inorganic insulating film 203 are etched, as shown in FIG. 19(*b*) by dry etching processing with the resist pattern as a mask by means of an etching apparatus not shown for the wafer W. Thereby, the organic insulating film pattern 202*a* and the inorganic insulating film pattern 203*a* in which a concave portion 211 corresponding to the connecting plug is formed can be formed. Here, the etching processing is performed using $CF_4$ gas, for example (S48).

Thereafter, as shown in FIG. 19(*c*), titanium nitride (TiN) for protecting the side walls to prevent diffusion of copper is formed on the side walls inside the concave portion 210 corresponding to the wiring and the concave portion 211 corresponding to the connecting plug by means of a plasma CVD apparatus not shown. Ti, TiW, Ta, TaN, WSiN, and the like can be used as the film for side wall protection, in addition to TiN.

Then, as shown in FIG. 19(*d*), copper 207 is buried inside the concave portion 210 corresponding to the wiring and the concave portion 211 corresponding to the connecting plug through the use of, for example, electroplating. Thereafter, copper on the front face portion of the inorganic insulating film 205*a* over the concave portions is polished by a CMP apparatus to thereby leave copper only in the trench to form the wiring 207*b* and the connecting plug 207*a*. Thereby, the semiconductor device 200 is formed.

As described above, in this film forming system 1, the organic insulating films and inorganic insulating films are formed by the spin coating, whereby film forming processing for them can be performed in the same film forming system 1. Moreover, in the fabrication of the semiconductor device through the dual damascene process, the formation in the resist coating processing is performed by the spin coating as well we the formation of the layer insulating film composed of the organic insulating films and the inorganic insulating films, and therefore processing for them can be performed in the same film forming system 1. Accordingly, it is unnecessary to provide another CVD apparatus for forming the inorganic insulating films, thereby substantially decreasing the cost of the fabricating apparatus used for the fabrication of the semiconductor device through the dual damascene process.

Moreover, in the aforesaid embodiments, heat processing is performed in a low-oxygen atmosphere in each of the low-temperature heat processing unit (LHP) and the low-oxygen and high-temperature heat processing unit (OHP) each for vaporizing the solvent in the coating film when the inorganic insulating film is formed, thereby preventing oxidation of the coating film on the wafer W by reaction with oxygen. Furthermore, the inside of the processing station 3 is maintained in a low-oxygen atmosphere, whereby oxidation of the coating film is retarded during transfer of the wafer W between units after the heat processing for vaporizing the solvent until the heat processing in the low-oxygen curing and cooling processing unit (DCC). Consequently, the heat processing in the low-oxygen curing and cooling processing unit (DCC) is properly performed, thereby decreasing insufficient insulation and the like and improving yields.

In addition to the above configurations, the supply of the developing solution may be performed by a spin coating in the developing solution coating process.

The aforesaid embodiments are explained with the given example of the dual damascene method, and it is needless to say that the present invention can be applied to a single damascene method.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims. For instance, a substrate to be processed is not limited to a semiconductor wafer, but other substrates such as an LCD substrate and the like are available.

What is claimed is:

1. A film forming system, comprising:

a first coating apparatus for supplying an organic coating solution to a substrate to form an organic coating film;

a second coating apparatus for supplying an inorganic coating solution to a substrate to form an inorganic coating film;

a first heating apparatus for vaporizing a solvent component from the applied organic coating solution;

a second heating apparatus for performing thermal processing for the substrate from which the solvent component has been vaporized in the first heating apparatus;

a delivery section for delivering the substrate between the first heating apparatus and the second heating apparatus;

wherein a first area, a second area, and the inside of a processing chamber of the first heating apparatus can all be set at an atmosphere lower in oxygen than the surrounding air, the second heating apparatus and the delivery section disposed in the first area and the first heating apparatus disposed in the second area;

the second heating apparatus is removably connectable with the first heating apparatus;

the first area is covered with a panel as a partition to form a space, the panel is provided with a carrying in/out port through which the substrate is delivered by the delivery section between the first area and the second area, the carrying in/out port can be opened and closed by a shutter which is closed when the substrate has been delivered from the second area to the first area; and the processing chamber of the first heating apparatus is connected with a gas supply source and with a gas exhaust port for setting the atmosphere in the second area lower in oxygen than the surrounding air, and the panel is connected with a second gas supply source and with a second gas exhaust port for setting the atmosphere in the first area lower in oxygen than the surrounding air.

2. The system as set forth in claim 1, wherein the organic coating solution is applied by a spin coating.

3. The system as set forth in claim 1, wherein the processing chamber of said first heating apparatus is structured to be maintainable of airtightness, and wherein said first heating apparatus includes exhaust means for decreasing a pressure in the processing chamber, the exhaust means exhausts through the gas exhaust port.

* * * * *